US012663845B2

(12) United States Patent
Wolford et al.

(10) Patent No.: US 12,663,845 B2
(45) Date of Patent: Jun. 23, 2026

(54) COOLING ELEMENT TYPE DETERMINATION AND CONTROL

(71) Applicant: Lenovo Enterprise Solutions (Singapore) Pte. Ltd., New Tech Park (SG)

(72) Inventors: Robert R Wolford, Strongsville, OH (US); Brian C Totten, Durham, NC (US); Clifton E Kerr, Morrisville, NC (US)

(73) Assignee: Lenovo Enterprise Solutions (Singapore) Pte. Ltd., New Tech Park (SG)

( * ) Notice: Subject to any disclaimer, the term of this patent is extended or adjusted under 35 U.S.C. 154(b) by 383 days.

(21) Appl. No.: 18/232,687

(22) Filed: Aug. 10, 2023

(65) Prior Publication Data

US 2025/0053212 A1      Feb. 13, 2025

(51) Int. Cl.
*G06F 1/20*          (2006.01)
*H05K 7/20*          (2006.01)
(Continued)

(52) U.S. Cl.
CPC ......... *G06F 1/206* (2013.01); *H05K 7/20836* (2013.01); *G01D 3/022* (2013.01);
(Continued)

(58) Field of Classification Search
CPC ... H04B 1/02; G06F 1/20; G06F 1/206; G06F 11/006; H05K 7/20836; H05K 7/20727;
(Continued)

(56) References Cited

U.S. PATENT DOCUMENTS 7,233,120 B2 * 6/2007 Romero Pintado ....... G06F 1/20
                                                           318/504
7,313,466 B2 * 12/2007 Chang ................ H05K 7/20209
                                                           361/679.48

(Continued)

FOREIGN PATENT DOCUMENTS

CN          202928712 U  *  5/2013
CN          103822720 A  *  5/2014
(Continued)

OTHER PUBLICATIONS

Computer translation of CN_106092352_A (Year: 2025).*
Computer translation of CN_10382270_A (Year: 2025).*
Computer translation of CN_20928712_U (Year: 2025).*

*Primary Examiner* — Randy W Gibson
(74) *Attorney, Agent, or Firm* — Kunzler Needham & Hilton; Bruce R. Needham

(57)          ABSTRACT
A method for detecting a cooling element type includes determining a quantity of cooling elements for a computing device. Each of the cooling elements is of a cooling element type. The method includes causing each cooling element to operate at a test pulse width modulation ("PWM") value. Each cooling element is controlled using PWM. The method includes measuring a total current draw of the cooling elements and comparing the total current draw to each of a predicted current draw at the test PWM value of a quantity of cooling elements of a particular cooling element type. The quantity of cooling elements of each of the cooling element types matches the determined quantity of the plurality of cooling elements. The method includes determining, based on the comparing, whether each of the plurality of cooling elements are of a same cooling element type or are of a mixture of cooling element types.

20 Claims, 11 Drawing Sheets

300

(51) Int. Cl.
   *G01D 3/02*         (2006.01)
   *G01R 31/28*       (2006.01)
   *H04B 1/02*        (2006.01)

(52) U.S. Cl.
   CPC ............ *G01R 31/2829* (2013.01); *H04B 1/02*
       (2013.01); *H05K 7/20727* (2013.01); *H05K*
                        *7/20772* (2013.01)

(58) Field of Classification Search
   CPC ........... H05K 7/20772; H05K 7/20209; G01R
                         31/2829; G01D 3/022
   See application file for complete search history.

(56)            References Cited

U.S. PATENT DOCUMENTS

| | | | | |
|---|---|---|---|---|
| 7,319,299 | B2 * | 1/2008 | Freeman | ................... G06F 1/20 |
| | | | | 318/400.08 |
| 7,387,499 | B2 * | 6/2008 | Flanigan | .............. F04D 27/001 |
| | | | | 417/42 |
| 7,791,301 | B2 * | 9/2010 | Huang | .............. H05K 7/20209 |
| | | | | 318/473 |
| 8,368,338 | B2 * | 2/2013 | Shen | ....................... G06F 1/206 |
| | | | | 318/473 |
| 8,788,111 | B2 * | 7/2014 | Uhlmann | ................ G06F 1/206 |
| | | | | 700/304 |
| 9,322,681 | B2 * | 4/2016 | Cowles | ................... G06F 1/206 |
| 10,135,470 | B2 * | 11/2018 | Gopisetti | ................. H04B 1/02 |
| 2006/0291160 | A1 * | 12/2006 | Freeman | .............. F04D 29/582 |
| | | | | 361/679.48 |
| 2007/0019383 | A1 * | 1/2007 | Chang | ............... H05K 7/20209 |
| | | | | 361/695 |
| 2008/0133170 | A1 * | 6/2008 | Engelstad | ................ G01K 7/16 |
| | | | | 374/E7.018 |
| 2009/0015241 | A1 * | 1/2009 | Gross | ........................ G01P 3/48 |
| | | | | 324/166 |
| 2010/0302008 | A1 * | 12/2010 | Engelstad | ................ G01K 7/20 |
| | | | | 340/10.1 |
| 2013/0054047 | A1 * | 2/2013 | Uhlmann | ................ G06F 1/206 |
| | | | | 700/300 |
| 2013/0138364 | A1 * | 5/2013 | Cowles | ................... G06F 1/206 |
| | | | | 702/182 |
| 2016/0349311 | A1 * | 12/2016 | Hayashi | ............... G01R 21/133 |
| 2018/0373300 | A1 * | 12/2018 | Bhatia | .................... G06F 1/206 |

FOREIGN PATENT DOCUMENTS

| | | | | | |
|---|---|---|---|---|---|
| CN | | 106092352 | A | * | 11/2016 ............... G01K 7/22 |
| WO | WO-2021015760 | A1 | * | 1/2021 ............... G06F 1/20 |

* cited by examiner

200

300

600

Begin

602 — Determine a Quantity of Cooling Elements

604 — Cause the Cooling Elements to Operate at a Test PWM Value

606 — Determine Ranges of a Predicted Current Draw

608 — Measure a Total Current Draw

610 — Compare Total Current Draw to Predicted Current Draw

612 — Determine Whether Cooling Elements are of the Same Type or of a Mixture

End

COOLING ELEMENT TYPE DETERMINATION AND CONTROL

FIELD

The subject matter disclosed herein relates to methods, systems, and apparatuses related to server cooling elements and more particularly relates to cooling element type determination and control.

BACKGROUND

In server systems, cooling elements, such as fans and pumps, help to maintain optimal operating temperatures and ensure reliable performance of the server and its components. Some cooling elements are controlled using pulse width modulation ("PWM"). Some servers include multiple PW-modulated cooling elements.

BRIEF SUMMARY

A method for detecting a cooling element type is disclosed. The method includes determining a quantity of a plurality of cooling elements providing cooling for a computing device. Each of the plurality of cooling elements is of a cooling element type of a plurality of cooling element types. The method includes causing each of the plurality of cooling elements to operate at a test PWM value. Each cooling element of the plurality of cooling elements is controlled using PWM. The method includes measuring a total current draw of the plurality of cooling elements. The method includes comparing the total current draw to each of a predicted current draw at the test PWM value of a quantity of cooling elements of a particular cooling element type of the plurality of cooling element types. The quantity of cooling elements of each of the cooling element types matches the determined quantity of the plurality of cooling elements. The method includes determining, based at least in part on the comparing, whether each of the plurality of cooling elements are of a same cooling element type or are of a mixture of cooling element types.

An apparatus is also disclosed. The apparatus includes a determination module configured to determine a quantity of a plurality of cooling elements providing cooling for a computing device. Each of the plurality of cooling elements is of a cooling element type of a plurality of cooling element types. The apparatus includes a PWM module configured to cause each of the plurality of cooling elements to operate at a test PWM value. Each cooling element of the plurality of cooling elements is controlled using PWM. The apparatus includes a current measurement module configured to measure a total current draw of the plurality of cooling elements. The apparatus includes a comparison module configured to compare the total current draw to each of a predicted current draw at the test PWM value of a quantity of cooling elements of a particular cooling element type of the plurality of cooling element types. The quantity of cooling elements of each of the cooling element types matches the determined quantity of the plurality of cooling elements. The apparatus includes a type module configured to determine, based at least in part on the comparing, whether each of the plurality of cooling elements are of a same cooling element type or are of a mixture of cooling element types. At least a portion of the modules include hardware circuits, a programmable hardware device and/or code, the code stored on non-transitory computer readable storage media.

A system is also disclosed. The system includes a plurality of cooling elements. Each of the plurality of cooling elements is of a cooling element type of a plurality of cooling element types. The system includes a computing device for which the plurality of cooling elements provide cooling. The computing device includes a determination module configured to determine a quantity of a plurality of cooling elements providing cooling for a computing device. Each of the plurality of cooling elements is of a cooling element type of a plurality of cooling element types. The computing device also includes a PWM module configured to cause each of the plurality of cooling elements to operate at a test PWM value. Each cooling element of the plurality of cooling elements is controlled using PWM. The computing device also includes a current measurement module configured to measure a total current draw of the plurality of cooling elements. The computing device also includes a comparison module configured to compare the total current draw to each of a predicted current draw at the test PWM value of a quantity of cooling elements of a particular cooling element type of the plurality of cooling element types. The quantity of cooling elements of each of the cooling element types matches the determined quantity of the plurality of cooling elements. The computing device includes a cooling element type module configured to determine, based at least in part on the comparing, whether each of the plurality of cooling elements are of a same cooling element type or are of a mixture of cooling element types. At least a portion of the modules include hardware circuits, a programmable hardware device and/or code, the code stored on non-transitory computer readable storage media.

BRIEF DESCRIPTION OF THE DRAWINGS

A more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

Figure 1A:
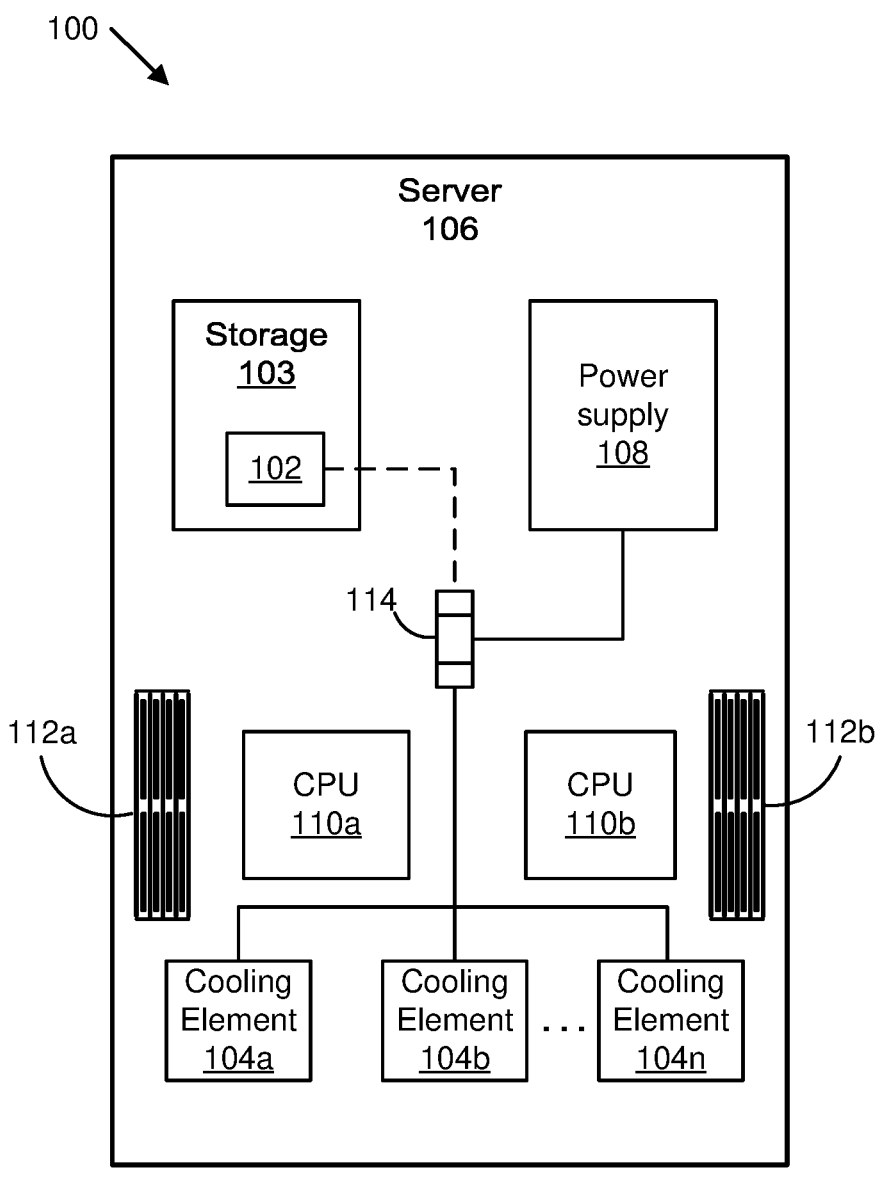
FIG. 1A is a schematic block diagram of a top view of a system for determining types of cooling elements, according to various embodiments.

As will be appreciated by one skilled in the art, aspects of the embodiments may be embodied as a system, method or program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a program product embodied in one or more computer readable storage devices storing machine readable code, computer readable code, and/or program code, referred hereafter as code. The storage devices, in some embodiments, are tangible, non-transitory, and/or non-transmission.

Many of the functional units described in this specification have been labeled as modules, in order to more particularly emphasize their implementation independence. For example, a module may be implemented as a hardware circuit comprising custom very large scale integrated ("VLSI") circuits or gate arrays, off-the-shelf semiconductors such as logic chips, transistors, or other discrete components. A module may also be implemented in programmable hardware devices such as a field programmable gate array ("FPGA"), programmable array logic, programmable logic devices or the like.

Modules may also be implemented in code and/or software for execution by various types of processors. An identified module of code may, for instance, comprise one or more physical or logical blocks of executable code which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of code may be a single instruction, or many instructions, and may even be distributed over several different code segments, among different programs, and across several memory devices. Similarly, operational data may be identified and illustrated herein within modules and may be embodied in any suitable form and organized within any suitable type of data structure. The operational data may be collected as a single data set, or may be distributed over different locations including over different computer readable storage devices. Where a module or portions of a module are implemented in software, the software portions are stored on one or more computer readable storage devices.

Any combination of one or more computer readable medium may be utilized. The computer readable medium may be a computer readable storage medium. The computer readable storage medium may be a storage device storing the code. The storage device may be, for example, but not limited to, an electronic, magnetic, optical, electromagnetic, infrared, holographic, micromechanical, or semiconductor system, apparatus, or device, or any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

More specific examples (a non-exhaustive list) of the storage device would include the following: an electrical connection having one or more wires, a portable computer diskette, a hard disk, a random access memory ("RAM"), a read-only memory ("ROM"), an erasable programmable read-only memory ("EPROM" or Flash memory), a portable compact disc read-only memory ("CD-ROM"), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Code for carrying out operations for embodiments may be written in any combination of one or more programming languages including an object oriented programming language such as Python, Ruby, R, Java, Java Script, Smalltalk, C++, C sharp, Lisp, Clojure, PHP, or the like, and conventional procedural programming languages, such as the "C" programming language, or the like, and/or machine languages such as assembly languages. The code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network ("LAN") or a wide area network ("WAN"), or the connection may be made to an external computer (for example, through the Internet using an Internet Service Provider).

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to," unless expressly specified otherwise. An enumerated listing of items does not imply that any or all of the items are mutually exclusive, unless expressly specified otherwise. The terms "a," "an," and "the" also refer to "one or more" unless expressly specified otherwise.

Furthermore, the described features, structures, or characteristics of the embodiments may be combined in any suitable manner. In the following description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, systems, and program products according to embodiments. It will be understood that each block of the schematic flowchart diagrams and/or schematic block diagrams, and combinations of blocks in the schematic flowchart diagrams and/or schematic block diagrams, can be implemented by code. This code may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

The code may also be stored in a storage device that can direct a computer, other programmable data processing apparatus, or other devices to function in a particular manner, such that the instructions stored in the storage device produce an article of manufacture including instructions which implement the function/act specified in the schematic flowchart diagrams and/or schematic block diagrams block or blocks.

The code may also be loaded onto a computer, other programmable data processing apparatus, or other devices to cause a series of operational steps to be performed on the computer, other programmable apparatus or other devices to produce a computer implemented process such that the code which execute on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and program products according to various embodiments. In this regard, each block in the schematic flowchart diagrams and/or schematic block diagrams may represent a module, segment, or portion of code, which comprises one or more executable instructions of the code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and code.

The description of elements in each figure may refer to elements of proceeding figures. Like numbers refer to like elements in all figures, including alternate embodiments of like elements.

As used herein, a list with a conjunction of "and/or" includes any single item in the list or a combination of items in the list. For example, a list of A, B and/or C includes only A, only B, only C, a combination of A and B, a combination of B and C, a combination of A and C or a combination of A, B and C. As used herein, a list using the terminology "one or more of" includes any single item in the list or a combination of items in the list. For example, one or more of A, B and C includes only A, only B, only C, a combination of A and B, a combination of B and C, a combination of A and C or a combination of A, B and C. As used herein, a list using the terminology "one of" includes one and only one of any single item in the list. For example, "one of A, B and C" includes only A, only B or only C and excludes combinations of A, B and C.

A method for detecting a cooling element type is disclosed. The method includes determining a quantity of a plurality of cooling elements providing cooling for a computing device. Each of the plurality of cooling elements is of a cooling element type of a plurality of cooling element types. The method includes causing each of the plurality of cooling elements to operate at a test pulse width modulation ("PWM") value. Each cooling element of the plurality of cooling elements is controlled using PWM. The method includes measuring a total current draw of the plurality of cooling elements. The method includes comparing the total current draw to each of a predicted current draw at the test PWM value of a quantity of cooling elements of a particular cooling element type of the plurality of cooling element types. The quantity of cooling elements of each of the cooling element types matches the determined quantity of the plurality of cooling elements. The method includes determining, based at least in part on the comparing, whether each of the plurality of cooling elements are of a same cooling element type or are of a mixture of cooling element types.

In some embodiments, in response to determining that each of the plurality of cooling elements are of a same cooling element type, the method includes determining from the measured total current draw which of the plurality of cooling element types comprise the plurality of cooling elements. The method also includes selecting current versus PWM data of the determined cooling element type and using the total current draw of the plurality of cooling elements and the current versus PWM data to control PWM for each of the plurality of cooling elements.

In some embodiments, the plurality of cooling element types includes two cooling element types. A predicted current draw of a first cooling element type at the test PWM value includes a first current. A predicted current draw of a second cooling element type at the test PWM value includes a second current different from the first current. Determining whether each of the plurality of cooling elements are of a same cooling element type or are of a mixture of cooling element types includes determining whether a measured total current draw of the plurality of current element: (i) matches a first product of the first current and the quantity of the plurality of cooling elements, signifying that the plurality of cooling elements are of the first cooling element type; (ii) matches a second product of the second current and the quantity of the plurality of cooling elements, signifying that the plurality of cooling elements are of the second cooling element type; or (iii) includes a current between the first product and the second product, signifying that the plurality of cooling elements includes cooling elements that are a mixture of the first cooling element type and the second cooling element type.

In some embodiments, the method includes determining a number of ranges of predicted current draws. Each range of the number of ranges corresponds to a type of the plurality of cooling element types. The test PWM value is within a PWM range such that values or ranges of predicted current draws of cooling elements of the plurality of cooling element types do not overlap. In some embodiments, the test PWM value is between zero and 20%. In some embodiments, the method includes sending a notification to a user in response to determining that each of the plurality of cooling elements are of the mixture of cooling elements. In some embodiments, each of the plurality of cooling elements includes a fan and/or a pump. In some embodiments, the method includes measuring the total current draw through a circuit protection component.

An apparatus is also disclosed. The apparatus includes a determination module configured to determine a quantity of a plurality of cooling elements providing cooling for a computing device. Each of the plurality of cooling elements is of a cooling element type of a plurality of cooling element types. The apparatus includes a pulse width modulation ("PWM") module configured to cause each of the plurality of cooling elements to operate at a test PWM value. Each cooling element of the plurality of cooling elements is controlled using PWM. The apparatus includes a current measurement module configured to measure a total current draw of the plurality of cooling elements. The apparatus includes a comparison module configured to compare the total current draw to each of a predicted current draw at the test PWM value of a quantity of cooling elements of a particular cooling element type of the plurality of cooling element types. The quantity of cooling elements of each of the cooling element types matches the determined quantity of the plurality of cooling elements. The apparatus includes a type module configured to determine, based at least in part on the comparing, whether each of the plurality of cooling elements are of a same cooling element type or are of a mixture of cooling element types. At least a portion of the modules include hardware circuits, a programmable hardware device and/or code, the code stored on non-transitory computer readable storage media.

In some embodiments, the apparatus includes a type determination module configured to, in response to the determination module determining that each of the plurality of cooling elements are of a same cooling element type, determine from the measured total current draw which of the plurality of cooling element types comprise the plurality of cooling elements. In some embodiments, the apparatus includes a PWM control module configured to select current versus PWM data of the determined cooling element type. The PWM control module is also configured to use the total current draw of the plurality of cooling elements and the current versus PWM data to control PWM for each of the plurality of cooling elements.

In some embodiments, the plurality of cooling element types includes two cooling element types. A predicted current draw of a first cooling element type at the test PWM value includes a first current. A predicted current draw of a second cooling element type at the test PWM value includes a second current different from the first current. The comparison module is further configured to determine whether a measured current draw of the plurality of cooling elements: (i) matches a first product of the first current and the quantity of the plurality of cooling elements, signifying that the plurality of cooling elements are of the first cooling element type; (ii) matches a second product of the second current and the quantity of the plurality of cooling elements, signifying that the plurality of cooling elements are of the second cooling element type; or (iii) includes a current between the first product and the second product, signifying that the plurality of cooling elements includes cooling elements that are a mixture of the first cooling element type and the second cooling element type.

The apparatus includes a range determination module configured to determine a number of ranges of predicted current draws. Each range of the number of ranges corresponds to a type of the plurality of cooling element types. The test PWM value comprises a PWM value at which none of the number of ranges overlap. In some embodiments, the test PWM value is within a PWM range such that values or ranges of predicted current draws of cooling elements of the plurality of cooling element types do not overlap. In some embodiments, the test PWM value is between zero and 20%. In some embodiments, the apparatus includes a notification module configured to send a notification to a user in response to the apparatus determining that each of the plurality of cooling elements are of a mixture of cooling elements. In some embodiments, each of the plurality of cooling element includes a fan and/or a pump.

A system is also disclosed. The system includes a plurality of cooling elements, each of the plurality of cooling elements of a cooling element type of a plurality of cooling element types. The system includes a computing device for which the plurality of cooling elements provide cooling. The computing device includes a determination module configured to determine a quantity of a plurality of cooling elements providing cooling for a computing device. Each of the plurality of cooling elements is of a cooling element type of a plurality of cooling element types. The computing device also includes a pulse width modulation ("PWM") module configured to cause each of the plurality of cooling elements to operate at a test PWM value. Each cooling element of the plurality of cooling elements is controlled using PWM. The computing device also includes a current measurement module configured to measure a total current draw of the plurality of cooling elements. The computing device also includes a comparison module configured to compare the total current draw to each of a predicted current draw at the test PWM value of a quantity of cooling elements of a particular cooling element type of the plurality of cooling element types. The quantity of cooling elements of each of the cooling element types matches the determined quantity of the plurality of cooling elements. The computing device also includes a cooling element type module configured to determine, based at least in part on the comparing, whether each of the plurality of cooling elements are of a same cooling element type or are of a mixture of cooling element types. At least a portion of the modules include hardware circuits, a programmable hardware device and/or code, the code stored on non-transitory computer readable storage media.

FIG. 1A is a schematic block diagram of a top view of a system 100 for determining types of cooling elements 104a, 104b, . . . , 104n (which may be referred to individually or collectively as "104"), according to various embodiments. As illustrated in FIG. 1A, a system 100 includes a computing device, such as a server 106. The server 106 includes a plurality of cooling elements 104 to provide cooling to the server 106 and/or to components of the server 106, such as the CPUs 110a, 110b and memory 112a, 112b. Although not shown in FIGS. 1A-C, the cooling elements 104 can also provide cooling to other components of the server 106, such as GPUs. The server 106 also includes storage 103 with a type determination apparatus 102, a power supply 108, and a circuit protection element 114.

Cooling elements 104 of servers 106 help to ensure that server components remain at operational temperatures. The plurality of cooling elements 104 includes a fan and/or a pump. Often, the cooling elements 104 include unintelligent cooling elements. In such embodiments, the cooling elements 104 are not capable of reporting their cooling element type. In some embodiments, the cooling elements 104 do not have dedicated pins for outputting their current draw, RPMs, or pump volume.

Figure 1B:
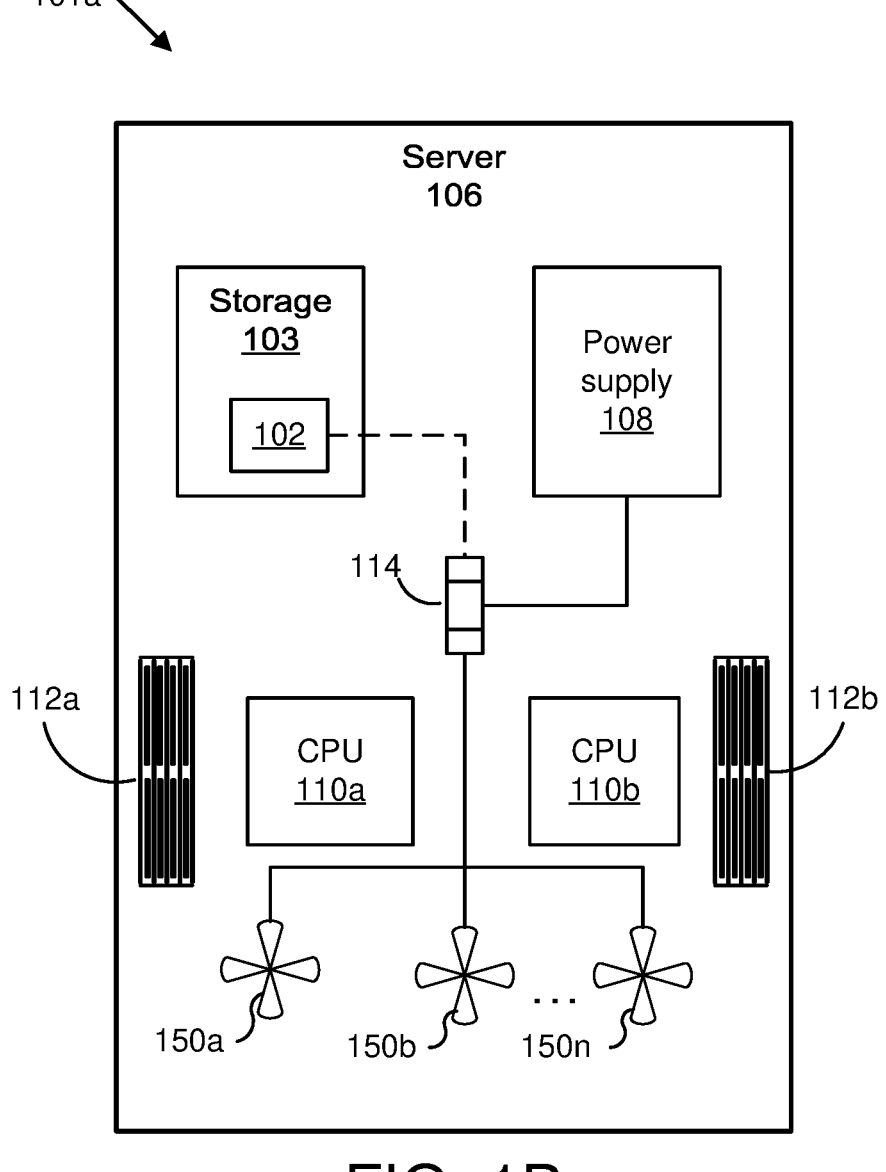
FIG. 1B is a schematic block diagram of a top view of a system for determining types of fans, according to various embodiments.
Figure 1C:
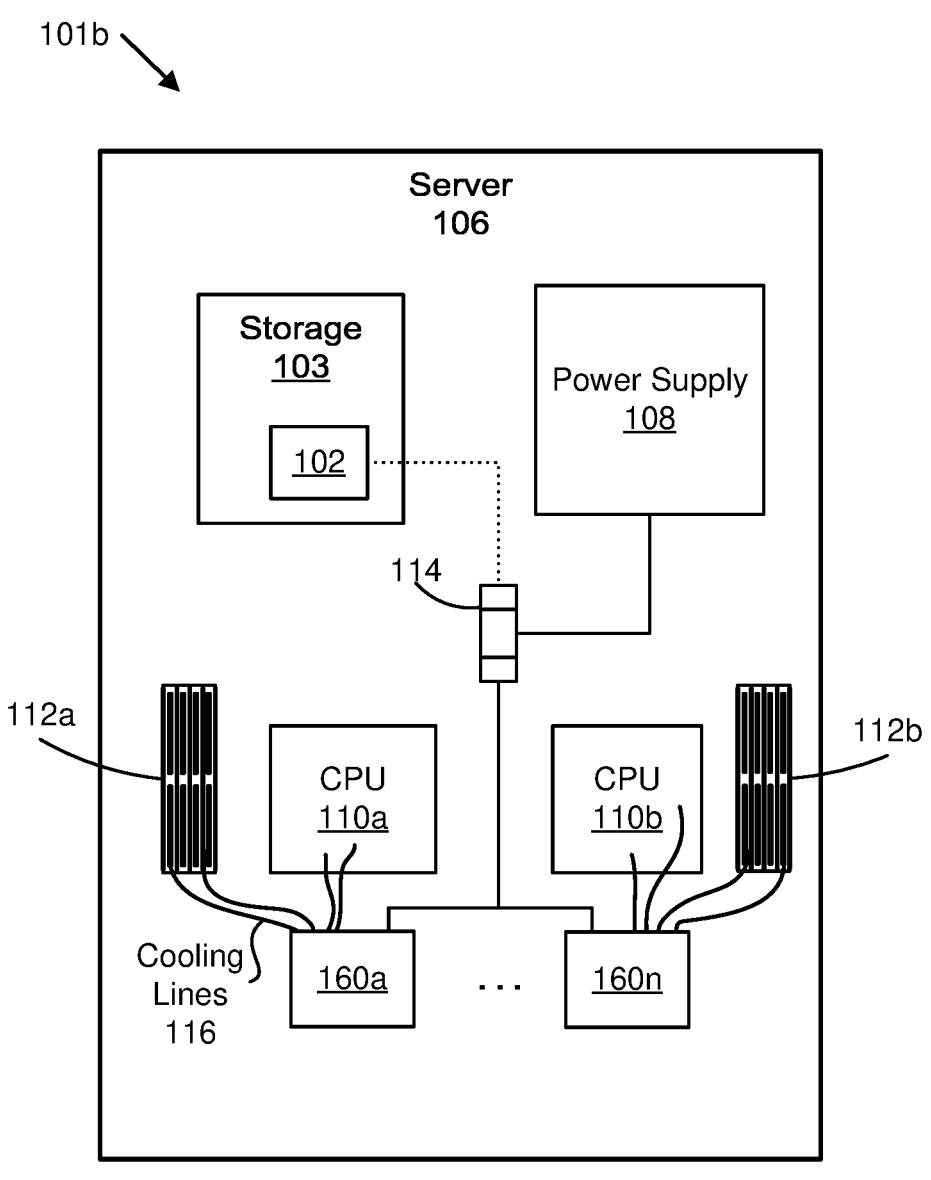
FIG. 1C is a schematic block diagram of a top view of a system for determining types of pumps, according to various embodiments.

In some embodiments, the cooling elements 104 are pulse width ("PW") modulated cooling elements. For example, the cooling elements 104 include at least one PW-modulated fan 150, as shown in FIG. 1B. In some embodiments, the cooling elements 104 include PW-modulated water pumps, as shown in FIG. 1C. PWM involves controlling the speed of rotation and/or water volume of cooling elements 104 by varying the duty cycle of a PWM signal. The duty cycle represents the ratio (or percentage) of time in which the PWM signal is in a high state compared to a low state. The duty cycle affects the average power delivered to the cooling element 104's motor, which in turn affects the cooling element 104's volume or speed.

Different types of cooling elements 104 operate at different speeds and/or volumes, even at the same PWM duty cycle rate. For example, two different types of fans 150 operate at different RPMs at a duty cycle of 80%. The first type slows down to zero RPM at a duty cycle of 0%, while the second type has a minimum RPM that is greater than zero even when the duty cycle is at 0%. Each of the plurality of cooling elements 104 are of a cooling element type of a plurality of cooling element types. As used herein, the term "cooling element type" refers to a level and/or range of current draw of the cooling element 104 while the cooling element 104 is operating at a certain pulse-width modulation ("PWM") operation level.

For example, cooling elements 104 that are of the same type each have a current draw in a given range for that cooling element type when operating at the same PWM level. PWM levels can be expressed as percentages of on time versus off time. For example, a cooling element operating at 95% PWM is operating on a power signal that is on 95% percent of the time and off 5% of the time. The percentage can also be referred to as a "duty cycle" or "duty factor." In some embodiments, the cooling element type is described by the "performance level" of the cooling elements 104. For example, high-performance types may have a higher current draw at 80% PWM than a current draw of medium-performance or low-performance types operating at 80% PWM.

As used herein, the phrase "cooling element species" refers to a classification of the physical components and/or operations of the cooling element 104 rather than to a "cooling element type" as defined above. Examples of cooling element species include "fan" and "pump."

As used herein, the phrases "cooling element type determination" and "determining cooling element types" describe at least one of the following: determining a type of one or more cooling elements of a plurality of cooling elements, determining whether the plurality of cooling elements are of the same type or are a mixture of types, or any combination thereof. In some examples, a server 106 may include two fans 150 of a first type, such as a standard fan, and one fan of a second type, such as a high performance fan.

In some embodiments, the cooling elements 104 are of different types. Determining whether each of the cooling elements 104 are of the same type or are of mixed types can help the user of a server 106 to determine whether adjustments to the cooling elements 104 should be made. For example, in some embodiments, the server 106 does not support or does not perform as well with cooling elements 104 of different types and/or of particular types. In some embodiments, a server 106 with cooling elements 104 of different types may not comply with a warranty. In such embodiments, notifying the user of the types of cooling elements 104 and/or of mismatches between the types of cooling elements 104 can be useful. Determining cooling element types can also help to enable better control of PW-modulated cooling elements.

Conventional methods for determining cooling element types often rely on a dedicated tachometer ("TACH") pin providing current, RPM, or water volume readings for each cooling element 104. The TACH pin provides a pulse signal that corresponds to the RPM of that cooling element. However, a dedicated TACH pin for each cooling element 104 adds complexity to the system 100, poses spatial constraints, and is not cost effective, particularly for systems 100 having multiple cooling elements 104.

Embodiments of the present disclosure can help to facilitate determining types of cooling elements 104 without the need for a dedicated signal (e.g., a TACH signal) or a dedicated pin (e.g., TACH pin). The server 106 includes a type determination apparatus 102. In some embodiments, the type determination apparatus 102 is within the storage 103 of the server 106. The type determination apparatus 102 is communicatively coupled to a circuit protection element 114. For example, the type determination apparatus 102 is communicatively coupled to the circuit protection element 114 via a wireless connection.

The circuit protection element 114 is coupled to a power supply 108 of the server 106 and is configured to prevent an oversupply of current from the power supply 108 to the cooling elements 104. In some examples, the circuit protection element 114 includes a device to limit current from the power supply 108 to levels that are safe for the cooling elements 104, such as an electronic fuse or "eFuse." Overcurrent to a cooling element 104 may cause damage and/or fire to the cooling element 104, wiring, traces, etc. and may damage the power supply 108. As shown in FIG. 1A, the circuit protection element 114 is positioned upstream from the cooling elements with respect to the power supply 108.

The power supply 108 typically provides power to the server 106, including power to the cooling elements 104. Typically, the power supply 108 provides one or more direct current ("DC") voltages to various elements of the server 106. In some embodiments, a power supply 108 is located within the server 106. In other embodiments, such as a rack-mounted system, the power supply 108 is located external to the server 106. In other embodiments, the server 106 includes a power supply 108 while a portion of power comes from an external power supply.

In some embodiments, the circuit protection element 114 is configured to measure the collective current draw from the cooling elements 104. In some embodiments, the circuit protection element 114 communicates the current draw to the type determination apparatus 102. In some embodiments, a baseboard management controller ("BMC") subsystem of the server 106 monitors the total current draw via the circuit protection element 114 and communicates the total current draw to the type determination apparatus 102. In some embodiments, the BMC subsystem is included in the type determination apparatus 102. Although not shown in FIG. 1A, in some examples, the circuit protection element 114 includes an output pin that indicates a voltage or a current that is proportional to the current being delivered by the circuit protection element 114 (i.e., the total current draw of the cooling elements 104). In another example, the circuit protection element 114 includes an intelligent component that outputs the total current draw directly via a digital serial bus. The digital serial bus includes, for example, a Power Management Bus, a System Management Bus, Inter-Integrated Circuit, or any combination thereof.

Although FIG. 1A shows a single circuit protection element 114 controlling three cooling elements 104, embodiments of the present disclosure are not so limited. For example, the server 106 includes multiple circuit protection elements 114, and each circuit protection element 114 protects an individual cooling element 104 or to a group of cooling elements 104. In such embodiments, the group of cooling elements 104 may be a subset of the plurality of cooling elements 104 of the server 106.

FIG. 1B is a schematic block diagram of a top view of a system 101a for determining types of fans 150a, . . . , 150n (which may be referred to individually or collectively as "150"), according to various embodiments. As shown in FIG. 1B, each of the cooling elements 104 includes a fan 150 configured to cool at least one component of the server 106 by moving cool air over the component. For example, as shown in FIG. 1B, the cooling elements 104 are positioned to cool the at least the CPUs 110a, 110b and the memory 112b. Embodiments of the present disclosure also include the cooling elements 104 being positioned to cool other components of the server 106 not shown in FIG. 1C, such as a GPU.

The cooling elements 104 are PW-modulated fans 150. PWM is used to control the RPM of the fans 150 and, thus, to control the cooling provided to the server 106. In some embodiments, each of the fans 150 are fed repeated pulses of power. The motors of the fans 150 are powered on and off at a rate that is dependent on the set duty cycle. Although not shown in FIG. 1B, in some embodiments, the system 101a includes a motherboard with a connector, such as a header connecting to each of the fans 150. In some embodiments, the connector is a header with a wire sending a PWM signal to a motor of the fan 150, which powers the motor on and off.

The circuit protection element 114 is positioned upstream of the fans 150 with respect to the power supply 108. Thus, the circuit protection element 114 limits current to the fans 150, which helps to limit current in a short circuit condition or some other condition where the fans 150 draw current above a specified limit.

FIG. 1C is a schematic block diagram of a top view of a system 101b for determining types of pumps 160, according to various embodiments. As shown in FIG. 1C, in some embodiments, the cooling elements 104 include pumps 160a, . . . , 160n, which may be referred to herein collectively or individually as "160". Each of the pumps 160 provides cooling to components of the server 106 via cooling lines 116. For example, as shown in FIG. 1C, the pumps 160 provide cooling to the memory 112a, 112b and/or CPUs 110a, 110b of the server 106 through cooling lines 116. The speed at which the pumps move water through the cooling lines 116 is proportional to the cooling accomplished, so controlling the speed of water movement through PWM also controls cooling of the components of the server 106.

Each of the pumps 160 includes a motor that controls movement of water into and through the cooling lines 116, and the pumps 160 are PW-modulated. In some embodiments, controlling the speed of the pumps 160 through PWM includes providing a pulsed signal to the motor of the pump 160 that turns the power of the motor on and off at a rate dependent on the set duty cycle. Although not shown in FIG. 1C, in some embodiments, the system 101b includes a motherboard with a connector, such as a header connecting to each of the pumps 160. In some embodiments, the connector is a header with a wire sending a PWM signal to a motor of the pump 160, which powers the motor on and off.

FIGS. 1A-C are meant to depict the functions and components of the systems 100, 101a, and 101b and are not drawn to scale. Those of skill in the art will appreciate that different arrangements of the elements illustrated in FIGS. 1A-C are within the scope of this disclosure. Additionally, although not shown in FIGS. 1A-C, in some embodiments, the cooling elements 104 include combinations of fans 150 and pumps 160.

Figure 2:
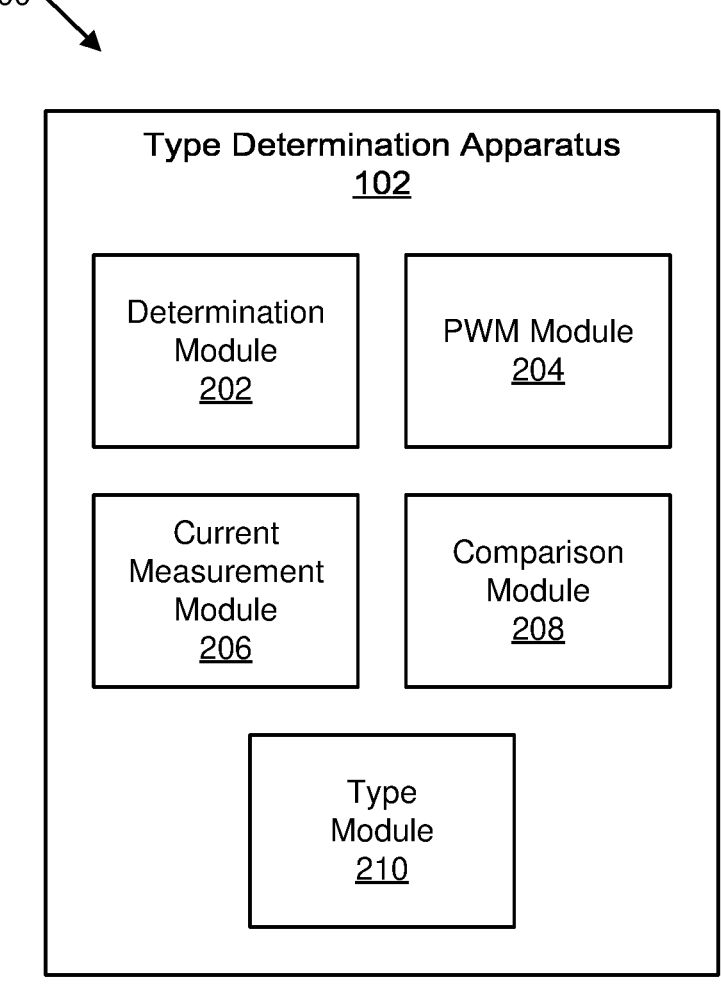
FIG. 2 is a schematic block diagram of an apparatus for determining types of cooling elements, according to various embodiments.

FIG. 2 is a schematic block diagram of an apparatus 200 for determining types of cooling elements 104, according to various embodiments. The apparatus 200 includes a type determination apparatus 102 as shown in FIGS. 1A-C. The apparatus 200 includes a type determination apparatus 102 with a determination module 202, a PWM module 204, a current measurement module 206, a comparison module 208, and a type module 210, which are described below. In some embodiments, all or a portion of the apparatus 200 is implemented with executable code stored on computer readable storage media. In other embodiments, at least a portion of the apparatus 200 is implemented using hardware circuits and/or a programmable hardware device.

The apparatus 200 includes a determination module 202 configured to determine a quantity of a plurality of cooling elements (e.g., cooling elements 104 of FIGS. 1A-C) providing cooling for a computing device (e.g., server 106 of FIGS. 1A-C). Each of the plurality of cooling elements are of a cooling element type of a plurality of cooling element types. In some embodiments, the determination module 202 determines the quantity of cooling elements 104 based on input from a user, specifications for the server 106, a current hardware configuration of the server 106, or any combination thereof.

In some examples, the determination module 202 determines a quantity of cooling elements 104 indirectly based on a hardware configuration of other components of the server 106, such as the CPUs 110a, 110b shown in FIGS. 1A-C. For example, the determination module 202 determines that the server 106 includes a quantity of CPUs 110a, 110b by determining a quantity of CPU sockets (not shown) that are populated. In some examples, if one CPU socket is populated, the determination module 202 determines that the server 106 includes only one CPU. In some embodiments, the determination module 202 determines the quantity of cooling elements 104 based at least in part on a quantity of cooling elements 104 required to cool the components of the server 106. For example, the determination module 202 assumes that at least four cooling elements 104 are needed to properly cool a CPU 110 of the server 106. The determination module 202 determines that the server 106 includes a single CPU. Based on determining that the server 106 includes a single CPU, the determination module 202 determines that the quantity of cooling elements 104 is at least four.

In some embodiments, the determination module 202 determines a number of cooling elements 104 based on a number of cooling element sockets of the server 106 and/or on a number of cooling element sockets that are populated. For example, although not illustrated herein, server 106 includes a number of sockets that the cooling elements 104 are configured to plug in to. The determination module 202 determines that the server 106 includes three cooling elements 104 based on determining that three of the sockets for the cooling elements 104 are populated. Determining that a socket for a cooling element 104, in some embodiments, includes detecting a current to the cooling element 104.

The determination module 202 is configured to determine the quantity of cooling elements based on a known system configuration. For example, in some embodiments, specifications for the server 106 include the quantity of cooling elements 104. The determination module 202 stores this information and/or accesses it from other parts of the storage 103. In some examples, the determination module 202 includes a processor the monitors the server 106, such as a BMC. The BMC determines a current configuration of the server 106 that includes the quantity of cooling elements 104.

The determination module 202 determines a quantity cooling elements 104 per circuit protection element 114. For example, the determination module 202 determines that the circuit protection element 114 controls current to three cooling elements 104.

The determination module 202 determines a range of a quantity of expected cooling elements 104. In some examples, the determination module 202 determines a range of a quantity of cooling elements 104 for cooling components of the server 106. In some embodiments, the determination module 202 determines a range of a quantity of expected cooling elements 104 that is the product of the quantity of a particular server component type (e.g., CPU 110a, 110b) and the range of the quantity of cooling elements 104 for cooling that particular type of component. In some examples, the determination module 202 determines that a range of two to four cooling elements 104 per CPU 110a, 110b provides optimal cooling for the CPU 110a, 110b. The determination module 202 determines, in some embodiments, that the server 106 includes two CPUs 110a, 110b. The determination module 202 determines, in some embodiments, an inclusive cooling element 104 range of four to eight cooling elements 104.

The apparatus 200 includes a PWM module 204. Each of the plurality of cooling elements 104 is controlled using PWM. The PWM module 204 is configured to cause each of the plurality of cooling elements 104 to operate at a test PWM, which is also referred to as a test duty cycle. In some embodiments, the cooling elements 104 each include a built-in motor driver. The PWM module 204 causes each of the cooling elements 104 to operate at the test PWM by setting the PWM of the cooling element 104's built-in motor driver. The motor driver of the cooling element 104 includes, for example, a DC motor, a brushless motor, an H-bridge, or any combination thereof. As discussed in connection with FIGS. 1B-1C, in some embodiments, the motor of the cooling element 104 is connected to a connector of a motherboard of the server 106, such as a header. The connector includes a connection through which a pulse signal is provided to the cooling element 104. In some embodiments, the PWM module 204 is configured to set the PWM of the cooling elements 104 via the connector's pulse signal connection.

Figure 9:
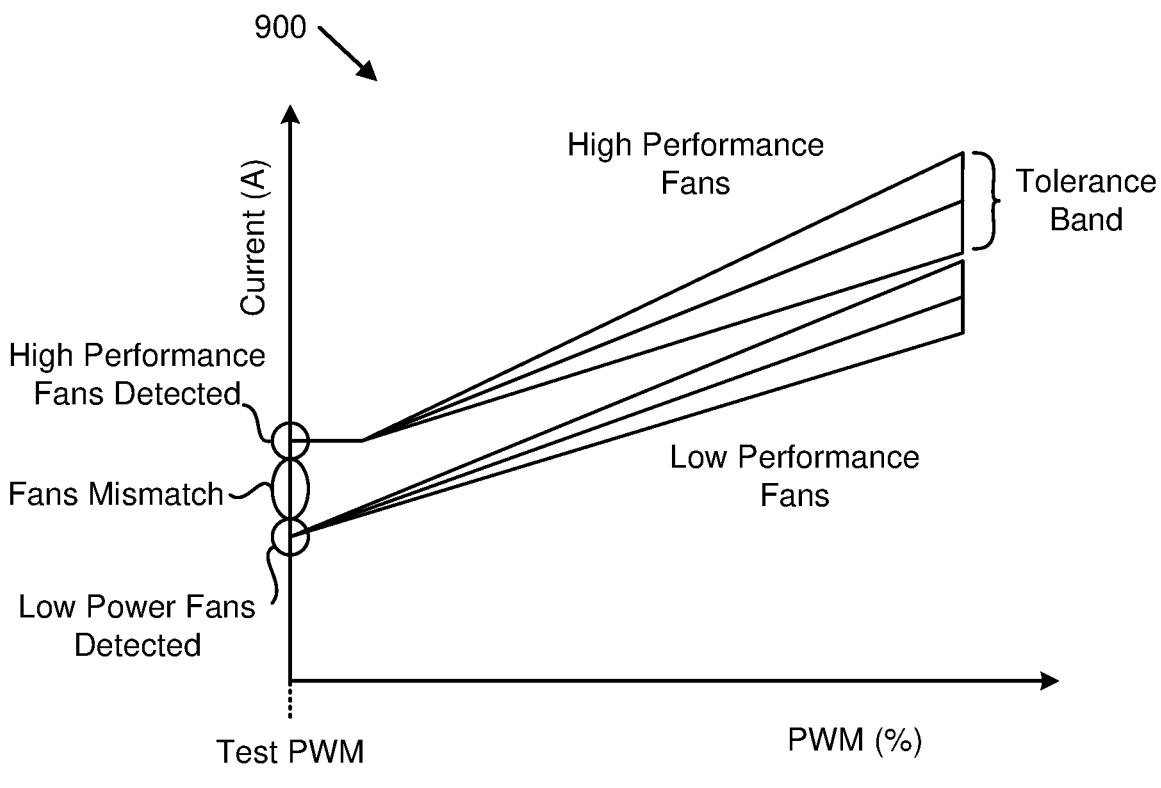
FIG. 9 is a diagram illustrating current versus pulse-width modulation for multiple high performance fans and a same number of low power fans, according to various embodiments.

In some embodiments, the test PWM is between zero and 20%. In such embodiments, the test PWM can be as low as zero and as high as 20%. In other embodiments, the test PWM is higher, such as 40%. In some embodiments, the test PWM is a PWM at which a cooling element 104 of a first type of the cooling element types operates at approximately zero RPM. FIG. 9 is a diagram 900 illustrating current versus pulse-width modulation for multiple high-performance fans 150 and a same number of low power fans 150, according to various embodiments. In the diagram 900, current-versus-PWM characteristics for a group of high-performance fans 150 and a group of low performance fans 150 are shown. For example, there may be three high-performance fans and three low power fans. The high-performance fans 150 generally draw more current than the low performance fans 150.

The current-versus-PWM characteristics depict a low PWM that is a test PWM. Note that current is not zero at the low or zero PWM indicating that a commanded PWM of zero equates to a minimum actual PWM so that the fans 150 operate at a minimum speed. In other embodiments, the test PWM is set to a higher value. Generally, the test PWM is selected at a value where there is no overlap in current to minimize ambiguity with regard to which type of fans 150 are in the server 106. At the test PWM, the high-performance fans 150 have a current that is significantly higher than the low power fans 150. A region along the test PWM line between the high-performance fan current and low power fan current is a region where there would be a mixture of fan types if a current is detected in this region.

As PWM increases, current varies for each fan type, as indicated by the tolerance band. While the tolerance bands of the high-performance fans and the low power fans do not intersect for clarity, in various examples the tolerance bands may overlap for higher PWMs. As a result, the test PWM should be chosen at a low PWM value where chances of overlap and ambiguity are minimized and where a mixture of fan types are more easily detected.

Note that the current-versus-PWM characteristics of the high-performance fans remain at a same PWM for a portion of the PWM range, indicating a minimum PWM at some value higher than the test PWM. This flat portion, in some embodiments, indicates that at a particular commanded PWM below the point where current starts to rise, there is a minimum actual PWM that will result in a minimum fan speed, and thus a minimum current. Some or all of the fans 150 or pumps 160 may include a minimum speed where current is flat.

Figure 10:
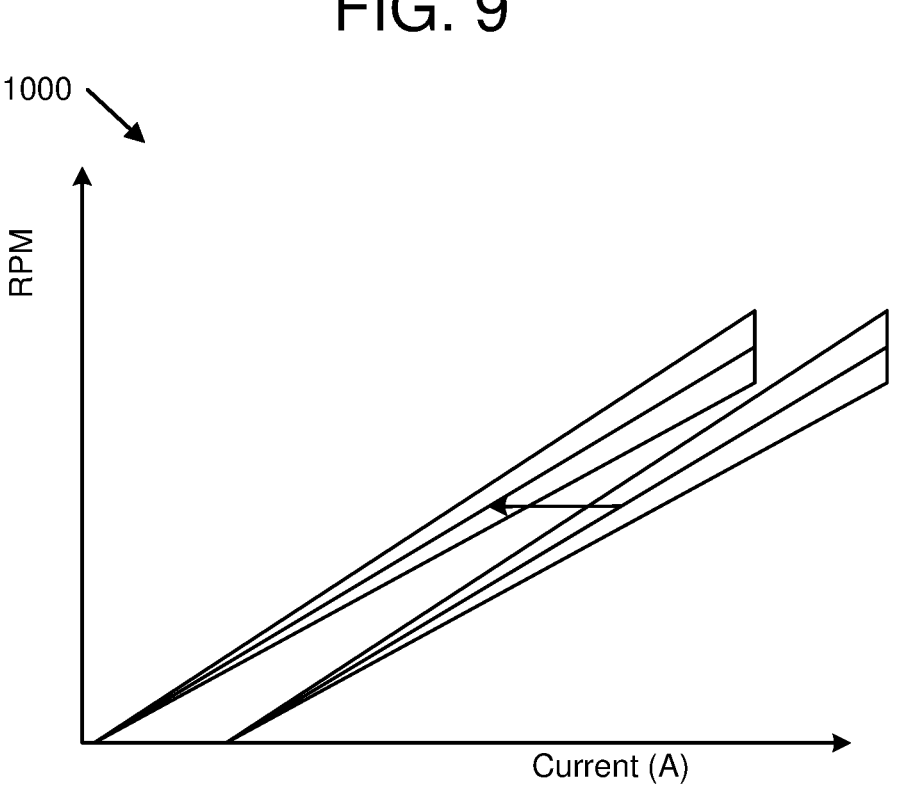
FIG. 10 is a diagram illustrating revolutions-per-minute ("RPM") versus current of a group of fans where one fan fails, according to various embodiments.

FIG. 10 is a diagram 1000 illustrating revolutions-per-minute ("RPM") versus current of a group of fans (e.g., fans 150 of FIG. 1B) where one fan fails, according to various embodiments. The diagram 1000 of FIG. 10 illustrates that if a fan in a fan group (e.g., fans 150 of FIG. 1B) fails, the current vs RPM curve shifts left and the type determination apparatus 102 is able to detect the fan failure.

In some embodiments, each of the cooling element types is able to be determined by an RPM and/or pump volume at which the cooling element 104 operates when the PWM is approximately equal to zero and/or when the PWM is at the test PWM. For example, the server 106 includes at least two fan types. In some embodiments, fans 150 that operate at an RPM above zero at the test PWM are classified as "high performance" fan types, and fans 150 that operate at an RPM of zero at the test PWM are classified as "low performance"

fan types. In other embodiments, both fan types have a non-zero current at a zero PWM. In another example, the apparatus 200 looks for more than two different types of fans 150. In some examples, fans 150 that operate at an RPM of zero at the test PWM are classified as "low performance" fan types, fans 150 that operate at a first RPM of above zero at the test PWM are classified as "mid performance" fan types, and fans 150 that operate at a second RPM greater than the first RPM are classified as "high performance" fan types.

As described in connection with FIG. 3, in some embodiments, the PWM module 204 estimates or accesses ranges of current draws of different cooling element types at different PWM rates. Generally, the estimated current draw increases as the duty cycle value increases for each cooling element type. The PWM module 204 selects a test PWM at which there is no overlap in any of the ranges for any of the potential cooling element types.

The apparatus 200 includes a current measurement module 206. The current measurement module 206 is configured to measure a total current draw of the plurality of cooling elements 104. In some embodiments, the total current draw is measured through one or more circuit protection elements 114. The circuit protection elements 114 then communicate the total current draw to the apparatus 200. In other embodiments, the total current draw is measured through one or more current meters or current monitoring circuits that are connected to each of the plurality of cooling elements 104. In some embodiments, the current measurement module 206 sums currents of more than one circuit protection element 114 to determine the total current draw of the plurality of cooling elements 104. In some embodiments, the current measurement module 206 is configured to measure the total current draw of the plurality of cooling elements 104 a certain delay period after the PWM module 204 causes the cooling elements 104 to operate at the test PWM. In some embodiments, the delay is set to avoid transients, delays, etc. affecting current of the cooling elements 104 associated with the PWM module 204 commanding a test PWM for the cooling elements 104.

The apparatus 200 includes a comparison module 208. The comparison module 208 is configured to compare the total current draw from the current measurement module 206 to each of a predicted current draw at the test PWM value of a quantity of cooling elements of a particular cooling element type. The particular cooling element type is a cooling element type that could correspond to at least one of the plurality of cooling elements 104. The quantity of cooling elements of the particular cooling element type matches the quantity of cooling elements 104 determined via the determination module 202.

For example, the determination module 202 determines that there are four fans 150 on the server 106 and/or that there are four fans 150 connected to a particular circuit protection element 114. The PWM module 204 causes each of the fans 150 to operate at a test PWM. After a delay period has passed, the current measurement module 206 measures the total current draw of the fans 150. The comparison module 208 then compares the total current draw measured by the current measurement module 206 to a predicted range of total current draw for four low-performance fans 150 operating at the test PWM, which is equivalent to four times the predicted range for a single low-performance fan operating at the test PWM. The comparison module 208 also compares the total current draw measured by the current measurement module 206 to a predicted range of total current draw for four high-performance fans 150 operating at the test PWM, which is equivalent to four times the predicted range for a single high-performance fan 150 operating at the test PWM. Where more than two cooling element types are used, the comparison module 208 compares the total current draw with a predicted current draw for each cooling element type.

The apparatus 200 includes a type module 210. The type module 210 is configured to determine, based at least in part on the comparison from the comparison module 208, whether each of the plurality of cooling elements 104 are of a same cooling element type or are of a mixture of cooling element types. In accordance with the example discussed above, the type module 210 determines that the cooling elements 104 are all low-performance cooling elements based on the comparison module 208 determining that the total current draw from the current measurement module 206 is equivalent to or within a range of predicted total current draw for four low-performance fans 150 at the test PWM. In another example, the type module 210 determines that the cooling elements 104 are all high-performance cooling elements based on the comparison module 208 determining that the total current draw from the current measurement module 206 is equivalent to or within a range of predicted total current draw for four high-performance fans 150 at the test PWM.

In another example, the type module 210 determines that the cooling elements 104 are of a mixture of cooling element types based on the comparison module 206 determining that the total current draw from the current measurement module 206 is outside of the range of predicted total current draw for any of the predicted cooling element types (e.g., low-performance, high-performance). As described herein, a mixture of cooling element types includes cooling elements 104 that are of at least two different types.

In some embodiments, the total current draw from the current measurement module 206 is determined to a particular accuracy. For example, the measured total current draw may be with 10 amperes ("A") and may have an accuracy of plus/minus 0.1 A. Likewise, the predicted current draw for a particular cooling element 104 may have an associated accuracy for a particular PWM so that at the test PWM, the predicted current draw is a range. In some embodiments, the type module 210 determines a type for the plurality of cooling elements 104 accounting for accuracy of the measured total current draw and the range of the predicted current at the test PWM. In some embodiments, the type module 210 used the accuracy of the measured total current and the range of the predicted current at the test PWM when determining that there is mixture of cooling element types.

In some embodiments, the type module 210 transmits the determined cooling element type to a controller of the cooling elements 104. The controller may then use appropriate current-versus-PWM curves for the determined number of cooling elements 104 for control. In other embodiments, the type module 210 transmits the determined cooling element type to a system administrator, a management server, or the like.

Embodiments of the present disclosure include determining types of cooling elements 104 for multiple groups of cooling elements 104. For example, although not shown in FIGS. 1A-1C, in some embodiments, the server 106 includes multiple circuit protection elements 114, and each circuit protection element 114 controls current flow to a plurality of cooling elements 104. In such embodiments, the determination module 202 determines a quantity of cooling elements 104 corresponding to each of the circuit protection elements 114. The current measurement module 206 measures the total current draw of each of the groups of cooling elements 104 via each circuit protection element 114. The comparison module 208 compares each total current draw to the expected ranges for the quantity of cooling elements 104 in each group. The type module 210 determines whether each of the groups of cooling elements 104 are all of the same type, of a mixture of types, and, if all of the same type, of which type. The type module 210 also determines whether all of the cooling elements 104 of the server 106 (i.e., amongst different groups of cooling elements 104) are of the same type, of a mixture of types, and, if all of the same type, of which type.

Figure 3:
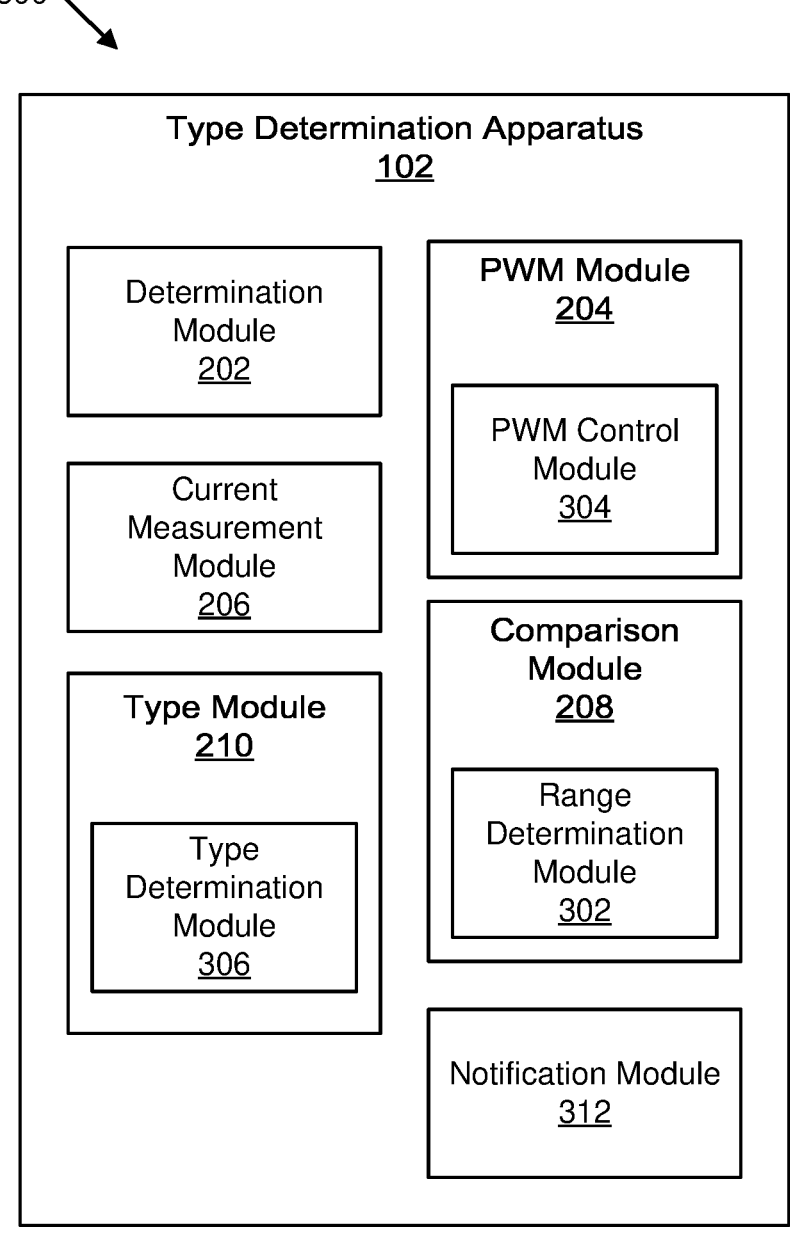
FIG. 3 is a schematic block diagram of another apparatus for determining types of cooling elements, according to various embodiments.

FIG. 3 is a schematic block diagram 300 of another apparatus 300 for determining types of cooling elements 104, according to various embodiments. The apparatus 300 includes a type determination apparatus 102 as shown FIGS. 1A-C and FIG. 2. The apparatus 300 includes a type determination apparatus 102 with a determination module 202, a PWM module 204, a current measurement module 206, a comparison module 208, and a type module 210, which are substantially similar to those described above with regards to the apparatus 200 of FIG. 2. In various embodiments, the apparatus 300 includes a PWM control module 304, a type determination module 306, a range determination module 302, and/or a notification module 312, which are described below. In some embodiments, the apparatus 300 is implemented in a similar way as the apparatus 200 of FIG. 2.

In some embodiments, apparatus 200 includes a range determination module 302. For example, the comparison module 302 includes the range determination module 302. The range determination module 302 is configured to determine a number of ranges of predicted current draws. Each range of the number of ranges corresponds to a type of the plurality of cooling element 104 types. In some embodiments, the range determination module 302 determines ranges for cooling element types by accessing data relating to current draw, PWM rate, and cooling element type that is stored in the server 106, in a management server, or other location. For example, in some embodiments, the storage 103 includes a dataset that provides a predicted range of current draw for a type of cooling element 104 operating at a particular PWM rate. For example, the range determination module 302 uses the dataset to find a predicted current draw range for a low-performance cooling element 104 operating at 40% PWM. In some embodiments, the range determination module 302 determines a predicted current draw range for a cooling element 104 based on the cooling element 104's species as well as type. For example, a "species" of cooling elements 104 includes "fan", "pump", or any other cooling element that can be configured to be PW-modulated. A low-performance fan 150 operating at 40% PWM, in some examples, has a different predicted current range than a low-performance pump 160 operating at 40% PWM.

In some embodiments, the dataset includes data pre-populated by a manufacturer of server 106. Additionally, or alternatively, the dataset is updated based on measured current readings for cooling elements 104 of known types at various PWM rates.

In some embodiments, the PWM module 204 is configured to select a test PWM value that is within a PWM range such that values or ranges of predicted current draws of cooling element 104 types (e.g., as determined by the range determination module 302) do not overlap, either for a single cooling element 104 or for the quantity of cooling elements 104 determined by the determination module 202.

In some embodiments, the range determination module 302 is configured to determine a range of a sum of current draws from cooling elements 104 of a particular type. The determination module 202 determines a quantity of the plurality of cooling elements 104. For example, the determination module 202 determines a quantity of four cooling elements 104 that are active on the server 106. The determination module 202 communicates this quantity to the range determination module 302. The range determination module 302 predicts a total current draw range for the quantity of cooling elements 104 for each possible cooling element 104 type.

In some embodiments, the predicted current draw of a first cooling element type at the test PWM value is a first current that is different from a predicted current draw of a second cooling element type at the test PWM value. The comparison module 208 is further configured to determine whether a measured total current draw of the plurality of cooling elements 104 matches a first product of the first current and the quantity of the plurality of cooling elements, signifying that the plurality of cooling elements 104 are of the first cooling element type. In the embodiments, the comparison module 208 is also configured to determine whether the measured total current draw matches a second product. The second product is the product of the second current and the quantity of cooling elements 104. The total current matching the second product signifies that the cooling elements 104 are all of the second cooling element type. For example, the range determination module 302 provides a first range that is a predicted total current draw range for four low-performance cooling elements 104 and a second range that is predicted total current draw range for four high-performance cooling elements 104. The comparison module 208 determines whether the measured total current draw from the current measurement module 206 is greater than, less than, or within each of the first range and the second range.

In some embodiments, the range determination module 302 also determines a range of total current draw to be expected from a plurality of cooling elements 104 of a third type. For example, the first type is a low-performance cooling element with the lowest RPMs at a test PWM. The second type is a high-performance cooling element with higher RPMs at the test PWM. The third type is a mid-performance cooling element 104 with RPMs between that of the first type and the second type at the test PWM. The range determination module 302 determines a range of a total current draw to be expected from a plurality of mid-performance cooling elements 104. The comparison module 208 determines whether the measured total current draw from the current measurement module is greater than, less than, or within the third range.

Although not shown in FIG. 3, in some embodiments, the comparison module 208 and/or the type determination apparatus 102 is configured to determine a fault in one or more cooling elements 104. For example, the determination module 202 determines a quantity of three cooling elements 104. If the total current draw measured by the current measurement module 206 is less than the range determination module's 302 predicted range for three low-performance cooling elements 104, the comparison module 208 determines that at least one of a cooling element 104, the circuit protection component 114, and/or the current measurement module 206 has a fault. In some embodiments, the notification module 312 notifies the user of the fault.

In some embodiments, the type module 210 is configured to determine, based on the comparison made by the comparison module 208 of the total current draw to the predicted ranges, a type of cooling element 104. In the embodiments, if the total current draw is within one of the predicted ranges of the range determination module 302, the type module 210 determines that the plurality of cooling elements 104 are each of the same type. In some embodiments, the apparatus 300 includes a type determination module 306. For example, the type module 210 includes the type determination module 306. The type determination module 306 is configured to, in response to the type module 210 determining that each of the plurality of cooling elements 104 are of the same cooling element type, determine from the measured total current draw which of the plurality of cooling element types make up the plurality of cooling elements 104. For example, the type determination module 306 determines that each of three cooling elements 104 are a low-performance type based on the total current draw being within the range determination module's range for three low-performance cooling elements.

In some embodiments, the type module 210 determines that the cooling elements 104 include a mismatch of cooling element 104 types. In the embodiments, the type determination module 306 determines a quantity of cooling elements 104 that are of a first type and a quantity of cooling elements 104 that are of a second type. For example, the comparison module 208 determines that the total current measurement from the current measurement module 206 is less than the range determination module's predicted current range for three high-performance cooling elements 104 and greater than the range determination module's predicted current range for three low-performance cooling elements 104.

The type determination module 306 estimates a proportion of the cooling elements 104 that are of a first type and a proportion of the cooling elements 104 that are of a second type. For example, the total current draw is approximately halfway between the upper end of the range of the first cooling element type (e.g., low performance) and the lower end of the range of the second cooling element type (e.g., high-performance). The type determination module 306 estimates that the three cooling elements 104 include two low-performance cooling elements 104 and one high-performance cooling element 104.

In some embodiments, the type determination module 306 is configured to determine types of multiple groups of cooling elements 104. Each group of cooling elements 104 receives voltage from the power supply 108 through a different circuit protection element 114. In the embodiments, the current measurement module 206 determines total current draw for each group of cooling elements 104 via current readings from each circuit protection element 114. In such embodiments, the determination module 202 determines not only a total number of cooling elements 104 of the server 106, but quantities of cooling elements 104 within each group of cooling elements 104. The type module 210 determines whether each group of cooling elements 104 includes a mixture of cooling element types or cooling elements 104 that are each of the same type. The type determination module 306 determines a type for each group of uniform cooling elements 104.

In some embodiments, the type determination module 306 determines that the groups of cooling elements 104 include groups of different types. For example, the type determination module 306 determines that a first group of cooling elements 104 contains low-performance cooling elements 104 and a second group includes high-performance cooling elements. Based on this determination, the type determination module 306 determines that, although each group of cooling elements 104 may include only cooling elements 104 of the same type, the server 106 includes cooling elements 104 of different types.

In some embodiments, the apparatus 200 includes a PWM control module 304. For example, the PWM module 204 includes the PWM control module 304. The PWM control module 304 is configured to select current versus PWM data of the cooling element type determined by the type determination module 306. The PWM control module 304 uses the total current draw of the plurality of cooling elements 104 and the current versus PWM data to control PWM for each of the plurality of cooling elements 104. For example, the apparatus 300 determines or receives an RPM needed for server 106 cooling. The type determination module 306 determines that each of the cooling elements 104 are high-performance types. The PWM control module 304 selects current versus PWM data for high-performance cooling element types. The PWM control module 304 determines a current draw at which the cooling element 104 operates at the desired RPM. The PWM control module 304 determines a PWM rate corresponding to that current draw in order to achieve the desired RPM.

Figure 7:
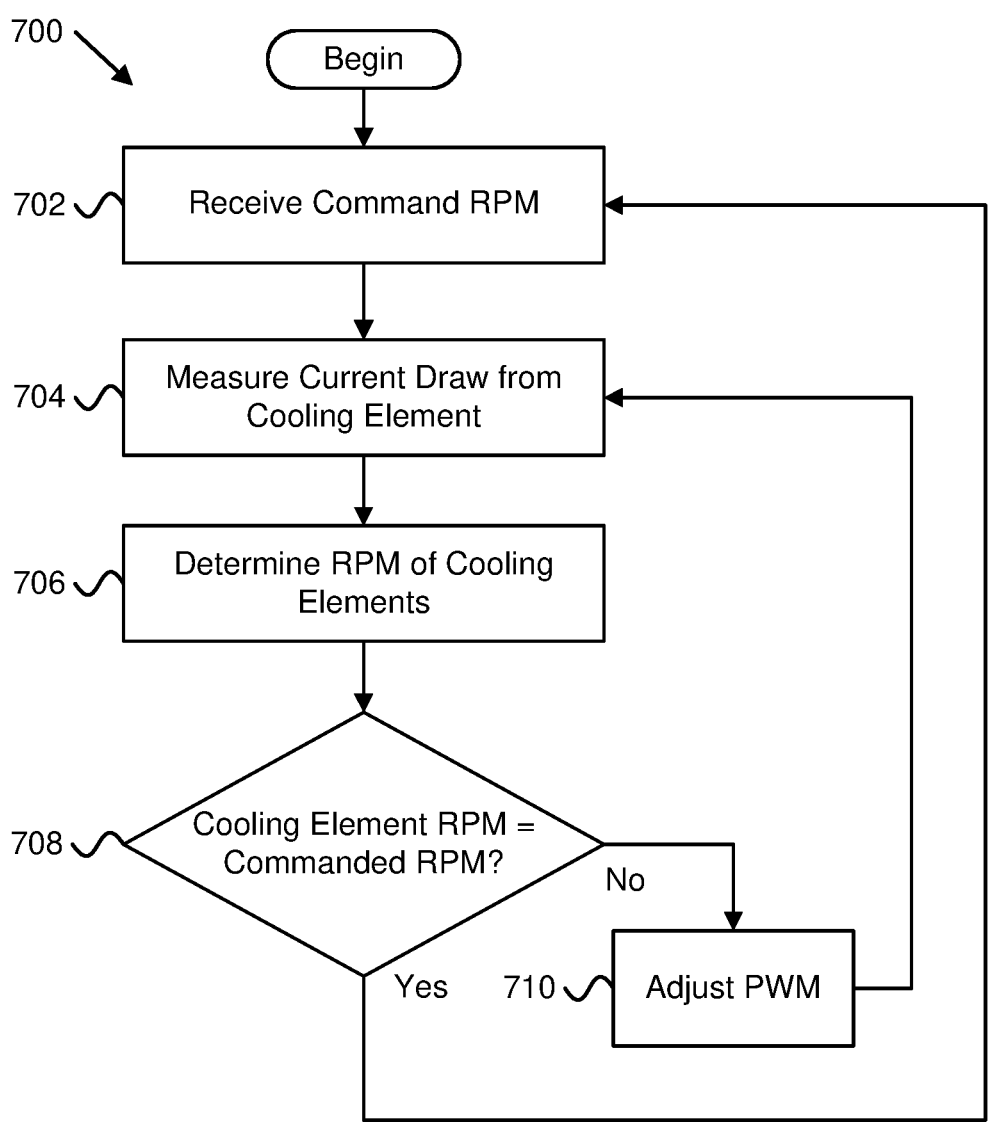
FIG. 7 is a schematic flow chart diagram of a method for controlling the revolutions per minute ("RPM") of a cooling element, according to various embodiments.

As shown in FIG. 7, in some embodiments the PWM control module 304 initiates a feedback loop with the current measurement module 206. In the embodiments, the PWM control module 304 sets a command PWM rate. After a delay period, the PWM control module 304 compares the measured total current from the current measurement module 206 to the current draw corresponding to the desired RPM. If the current draw is not within an acceptable deviation of the current draw corresponding to the desired RPM, the PWM control module 304 continues to adjust the PWM until the current draw is within an acceptable deviation of the current draw corresponding to the desired RPM.

In some embodiments, the notification module 312 sends a notification to a user in response to the type module 208 and/or type determination module 306 determining that the plurality of cooling elements are of a mixture of cooling element types. In some embodiments, the notification module 312 is also configured to notify the user of the types of cooling elements 104. In some embodiments, the notification module 312 is configured to notify the user that the server 106 contains mismatches in cooling element types based on (i) the type module 210 determining that cooling elements 104 of the same group are of different types and/or (ii) the type module 210 determining that a first group of cooling elements 104 is of a different type than a second group of cooling elements 104. In some embodiments, the notification module 312 is configured to transmit a notification containing information regarding the pump volume and/or RPM of the cooling elements 104. The notification module 312 is configured to notify a user, a management server, etc. when the cooling elements 104 are operating at a command RPM and/or pump volume (e.g., described in connection with the PWM control module 304).

Figure 4:
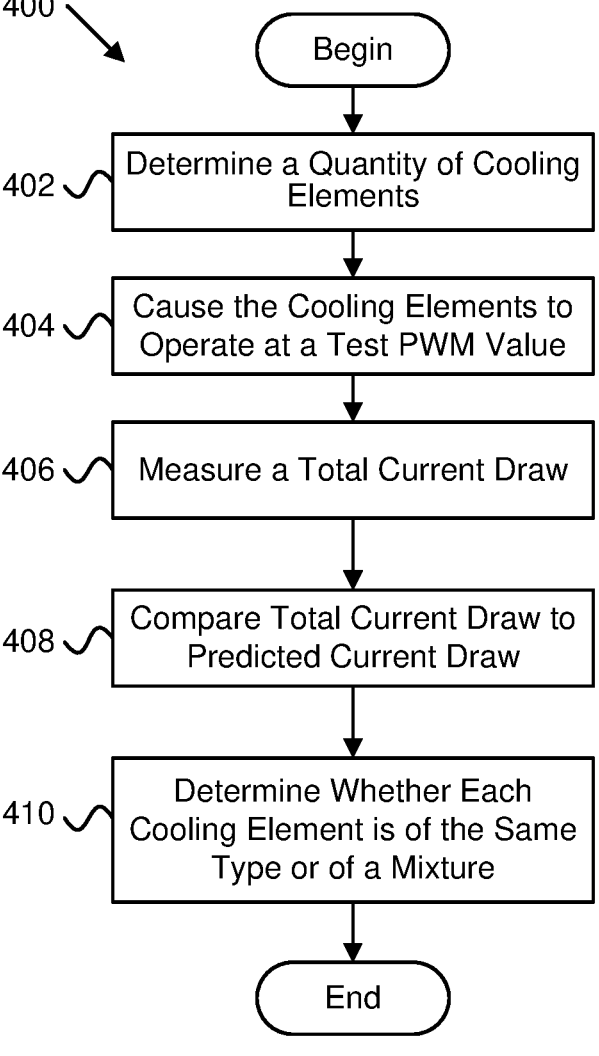
FIG. 4 is a schematic flow chart diagram of a method for determining a cooling element type, according to various embodiments.

FIG. 4 is a schematic flow chart diagram of a method 400 for determining a cooling element type, according to various embodiments. The method 400 begins and determines 402 a quantity of a plurality of cooling elements providing cooling for a computing device (e.g., cooling elements 104 providing cooling for server 106). Each of the plurality of cooling elements 104 are of a cooling element type of a plurality of cooling element types. The method 400 causes 404 each of the plurality of cooling elements to operate at a test PWM value. Each cooling element 104 is controlled using PWM.

The method 400 measures 406 a total current draw of the plurality of cooling elements 104. The method 400 compares 408 the total current draw to each of a predicted current draw at the test PWM value of a quantity of cooling elements of a particular cooling element type of the plurality of cooling element types. The quantity of cooling elements of each of the cooling element types matches the determined quantity of cooling elements 104. The method 400 determines 410, based at least in part on the comparing 408, whether each of the plurality of cooling elements 104 are of a same cooling element type or are of a mixture of cooling element types, and the method 400 ends. In various embodiments, all or a portion of the method 400 is implemented using the determination module 202, the PWM module 204, the current measurement module 206, the comparison module 208, and/or the type module 210.

Figure 5:
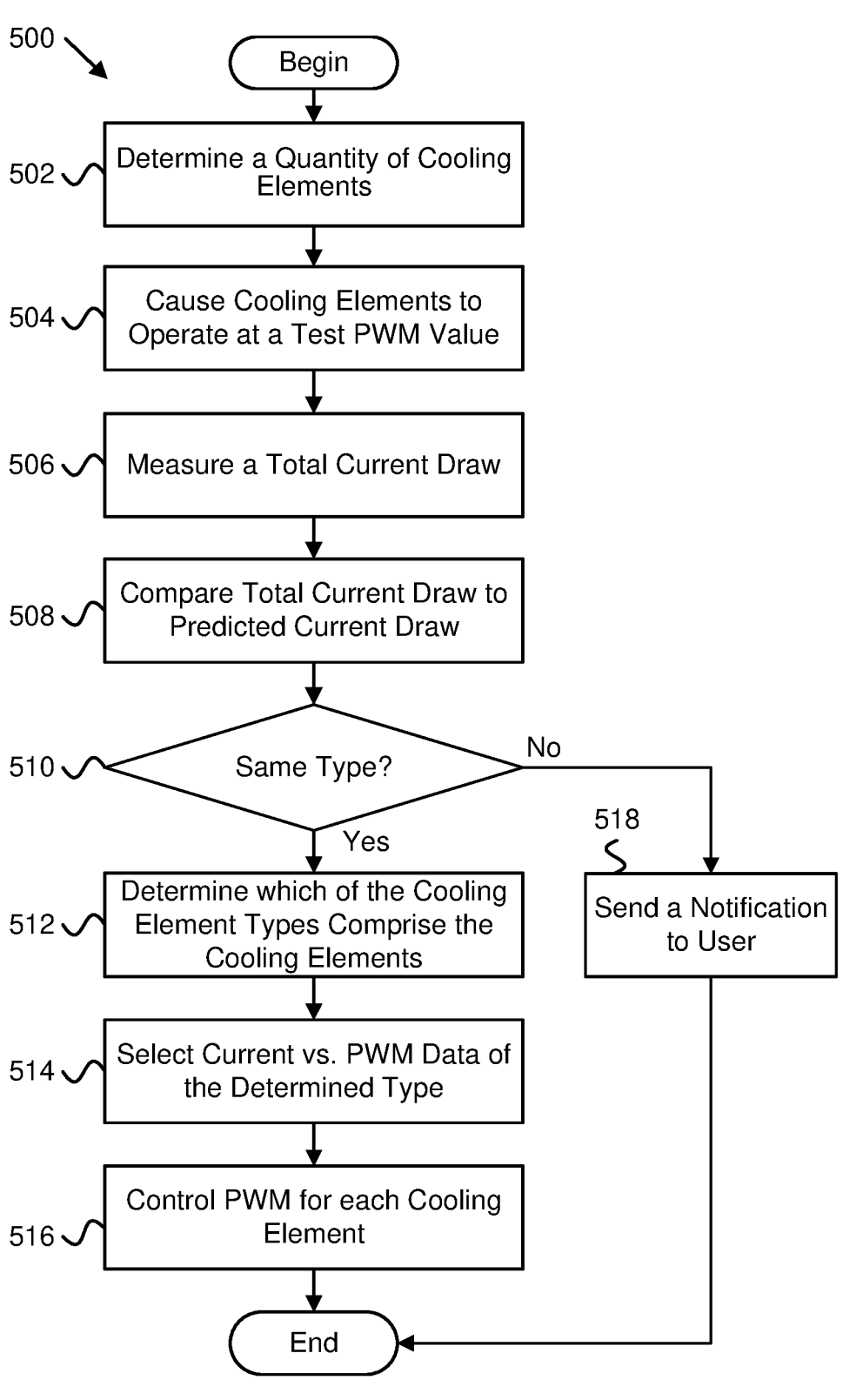
FIG. 5 is a schematic flow chart diagram of another method for determining a cooling element type, according to various embodiments.

FIG. 5 is a schematic flow chart diagram of another method 500 for determining a cooling element type, according to various embodiments. The method 500 begins and determines 502 a quantity of cooling elements of the plurality of cooling elements 104. The method 500 causes 504 each of the plurality of cooling elements 104 to operate at a test PWM value.

The method 500 measures 506 a total current draw of the plurality of cooling elements 104. In some embodiments, the method 500 measures 506 the total current through a circuit protection component, such as an eFuse. The method 500 compares 508 the total current draw to each of a predicted current draw at the test PWM value of a quantity of cooling elements of a particular cooling element type of the plurality of cooling element types. The quantity of cooling elements of each of the cooling element types matches the determined quantity of cooling elements 104. The method 500 determines 510, based at least in part on the comparing 508, whether each of the plurality of cooling elements 104 are of a same cooling element type or are of a mixture of cooling element types.

If the method 500 determines 510 that the cooling elements 104 are all of the same cooling element type, the method 500 determines 512 from the measured current draw, the cooling element type the plurality of cooling elements 104.

The method 500 selects 514 current versus PWM data of the determined cooling element type. The method 500 uses the total current draw of the plurality of cooling elements 504 and the current versus PWM data to control 516 PWM for each of the plurality of cooling elements 104, and the method 500 ends. If the method 500 determines 510 that the cooling elements 104 are not all of the same cooling element type, the method 500 sends 518 a notification to the user in response, and the method 500 ends. In other words, the method 500 sends 518 a notification to the user in response to determining that the plurality of cooling elements 104 are of a mixture of cooling element types. In various embodiments, all or a portion of the method 500 is implemented using the determination module 202, the PWM module 204, the current measurement module 206, the comparison module 208, the type module 210, the range determination module 302, the PWM control module 304, and/or the type determination module 306.

Figure 6:
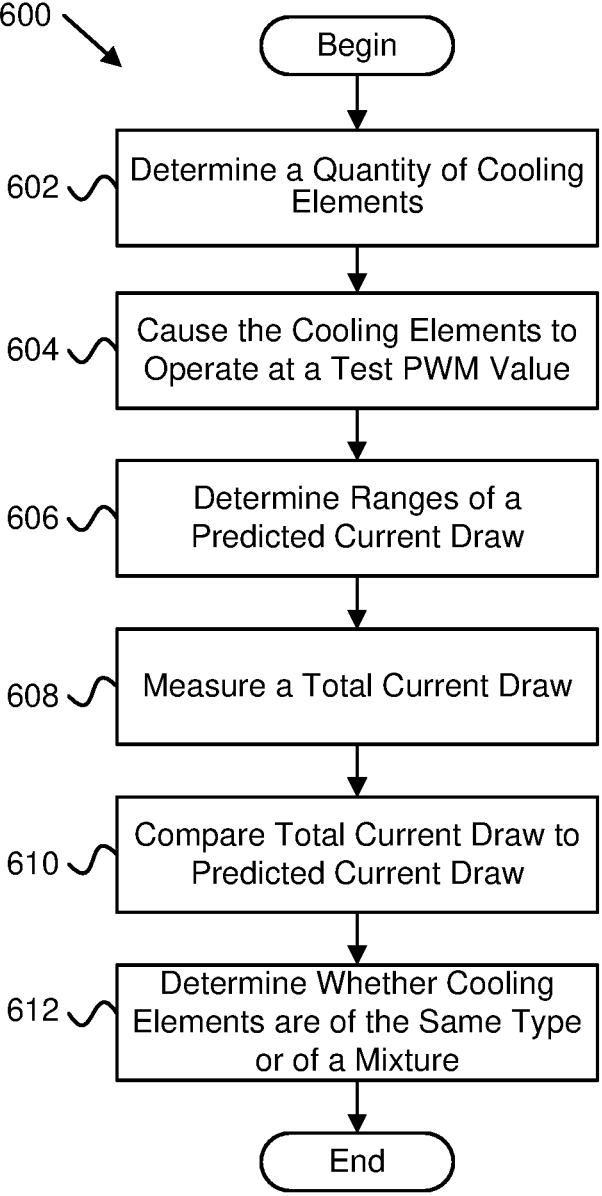
FIG. 6 is a schematic flow chart diagram of another method for determining a cooling element type, according to various embodiments.

FIG. 6 is a schematic flow chart diagram of another method 600 for determining a cooling element type, according to various embodiments. The method 600 begins and determines 602 a quantity of the plurality of cooling elements 104. The method 600 causes 604 each of the plurality of cooling elements 104 to operate at a test PWM value. The method 600 determines 606 a number of ranges of predicted current draws for each possible cooling element type. Each range of the number of ranges corresponds to a possible type of the plurality of cooling element types. A predicted current draw of a first cooling element type at the test PWM value includes a first current. A predicted current draw of a second cooling element type at the test PWM includes a second current different from the first current.

The method 600 measures 608 a total current draw of the plurality of cooling elements 104. The method 600 compares 610 the total current draw of step 608 to the predicted ranges of step 606. The method 600 determines 612 whether cooling elements are of the same type or of a mixture, and the method 600 ends. Determining 612 whether the cooling elements 104 are of the same type or a mixture includes determining whether the measured total current 608 of the plurality of cooling elements: (i) matches a first product of the first current and the quantity of the plurality of cooling elements 104, signifying that the plurality of cooling elements 104 each include the first cooling element type; (ii) matches a second product of the second current and the quantity of the plurality of cooling elements 104, signifying that the plurality of cooling elements 104 each include the second cooling element type; or (iii) is between the first product and the second product, signifying that the plurality of cooling elements 104 includes cooling elements that are a mixture of the first cooling element type and the second cooling element type.

In some embodiments, all or a portion of the method 600 is implemented using the determination module 202, the PWM module 204, the current measurement module 206, the comparison module 208, the type module 210, the range determination module 302, the PWM control module 304, and/or the type determination module 306.

FIG. 7 is a schematic flow chart diagram of a method 700 for controlling the revolutions per minute ("RPM") of a cooling element 104, according to various embodiments. For example, method 700 controls the RPM of a number of fan cooling elements, such as fans 150 of FIG. 1B. The method 700 begins and receives 702 a command RPM. For example, in some embodiments, the apparatus 102 receives a command RPM from the user.

The method 700 measures 704 current draw from each cooling element 104. The method 700 assumes that a commanded RPM is for one cooling element 104. For example, the method 700 measures 704 current draw through a circuit protection element 114 of a cooling element 104. For example, if the cooling elements 104 are all of the same type (e.g., an apparatus 102 determines through methods 400, 500, and/or 600 that the cooling elements 104 are all of the same type), the current draw of each cooling element is measured 704 by measuring the total current draw of all of the cooling elements 104 and dividing that current draw by the quantity of cooling elements 104.

The method 700 determines 706 the RPMs of the cooling elements 104 based on the current draw measured in step 704. For example, because the current draw is proportional to the RPM, the method 700 can determine the RPM of the cooling element 104 based on the current draw of that element 104. For example, the type module 208 of FIGS. 2 and 3 determines that the cooling elements 104 are all of the same type. The current measurement module 206 measures the total current draw of the cooling elements 104 through, for example, a circuit protection component. The method 700 determines per-cooling element 104 current draws by dividing the total current draw measured in step 704 to a known quantity of the cooling elements 104 (e.g., the quantity determined by the determination module 202). The method 700 determines the RPM of the cooling element 104 based on the current draw of the cooling element 704. In some embodiments, a module of the apparatus 102 of FIGS. 2 and 3 determines the RPM.

In some embodiments, the method 700 determines 706 the RPM of the cooling element 104 based on data stored in the server 106 (e.g., in storage 103) correlating current readings from the circuit protection element 114 and cooling element 104 RPM. For example, in some embodiments, the method 700 determines 706 the cooling element 104 RPM based on a lookup table in the BMC subsystem that maps current (e.g., circuit protection element 114 readings) to cooling element 104 RPM.

In some embodiments, the method 700 determines 706 the RPM of each cooling element 104 of the plurality of cooling elements 104 in response to the type module 210 determining that each of the plurality of cooling elements 104 are of the same type. In other embodiments, the method 700 determines 706 the RPM of each cooling element 104 of the plurality of cooling elements 104 by assuming that each of the plurality of cooling elements 104 from which a circuit protection element 114 reads current draw are of a same cooling element type.

The method 700 determines 708 whether the actual RPM of the cooling element 104 determined in step 706 is equivalent to the commanded RPM received in step 702. If the cooling element RPM is outside of a preferred range of deviation from the commanded RPM, the method 700 adjusts 710 the PWM level. For example, the method 700 determines 706 a cooling element RPM that is less than a received 702 commanded RPM. In response, the method 700 increases the PWM level from 60% to 80%. In some embodiments, the method 700 adjusts 710 the PWM level via the PWM control module 304 of the apparatus 102.

In some embodiments, the method 700 may be augmented to include detecting a cooling element 104 failure in response to determining 708 that the actual RPM of the cooling element 104 determined in step 706 is more than a given deviation less than the commanded RPM (not shown). For example, the method 700 determines that the difference between the actual RPM and the commanded RPM is such that the cooling element 104 likely has a fault. For example, the method 700 determines that the cooling element 104 is operating at an RPM that is below an expected RPM range for the cooling element 104 type. Additionally, or alternatively, the method 700 determines that the cooling element 104 has a current draw that is outside of the expected current draw range for the cooling element 104 type (e.g., the current draw range determined by the range determination module 302 of FIG. 3). In such embodiments, the method 700 further includes notifying a user of a fault in the cooling element 104.

After adjusting 710 the PWM, the method 700 repeats steps 704-710 until the method 700 determines 708 that the cooling element RPM is within an acceptable deviation of the command RPM. If the cooling element RPM is within an acceptable deviation of the command RPM, the method 700 returns and may eventually receive 702 another commanded RPM. In some embodiments, the method 700 is adjusted to use total current draw for determining RPM of the cooling elements 104. In some examples, the method 700 compares the total current draw of the cooling elements 104 with an RPM vs. current characteristic derived based on the determined number of cooling elements 104. In some examples, the method 700 multiplies current of an RPM vs. current characteristic by the determined number of cooling elements 104.

In various embodiments, the method 700 is implemented by the determination module 202, the PWM module 204, the current measurement module 206, the comparison module 208, the type module 210, the range determination module 302, and/or the PWM control module 304.

Figure 8:
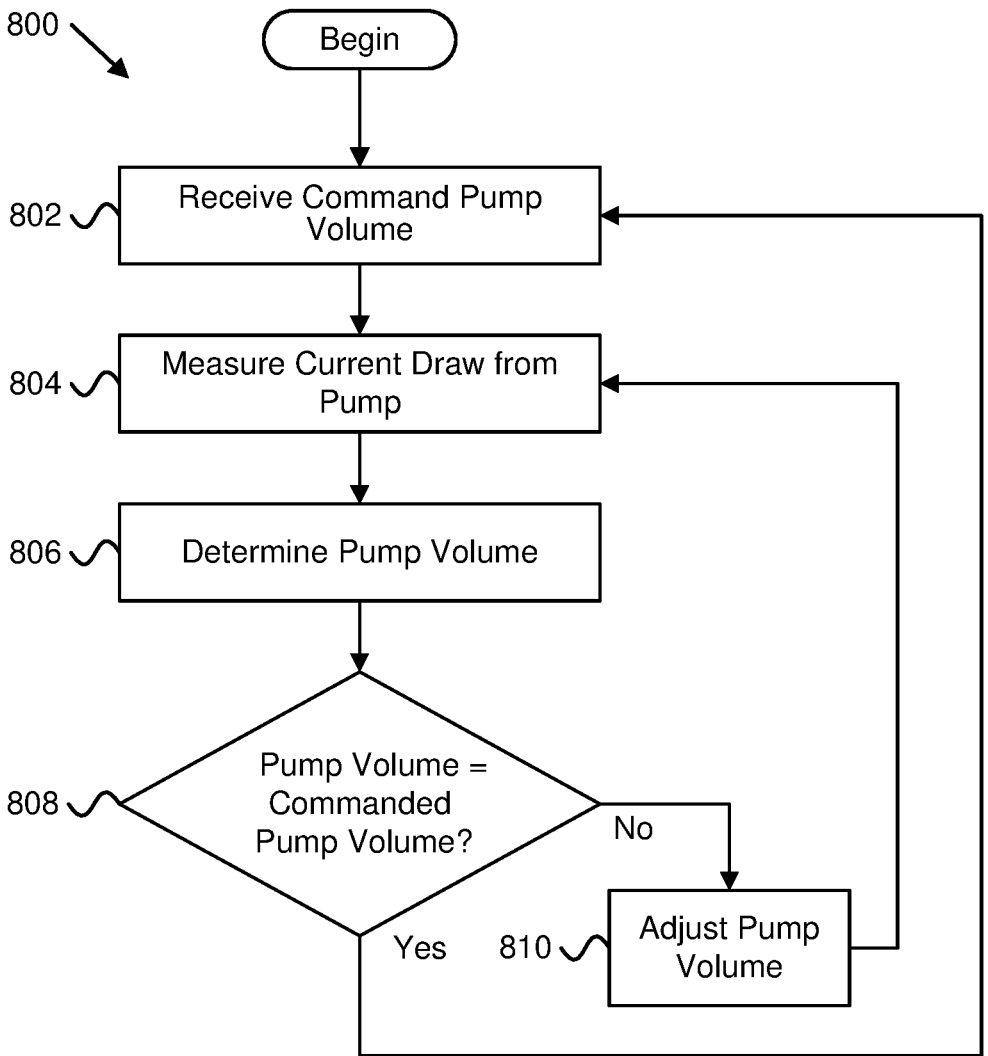
FIG. 8 is a schematic flow chart diagram of a method for controlling the pump volume of a cooling element, according to various embodiments.

FIG. 8 is a schematic flow chart diagram of a method 800 for controlling the pump volume of a cooling element, according to various embodiments. The method 800 receives 802 a command pump volume. In some embodiments, the command pump volume is a volume of water for a pump cooling element (e.g., pumps 160 in FIG. 1C) to displace over a given period of time. The method 800 measures 804 a current draw from a pump. In some embodiments, if a plurality of cooling elements 104 includes pumps that are all of the same type, the method 800 includes measuring a total current draw from the plurality of pumps 160.

The method 800 determines 806 the pump volume. If the plurality of cooling elements 104 includes pumps that are all of the same type, determining 806 the pump volume includes dividing the total current measured in step 804 by the quantity of pumps. Determining 806 the pump volume of each pump 160 is based on the current draw of each pump.

The method 808 determines whether the pump volume is equivalent, or within an acceptable deviation, of the command pump volume. In some embodiments, the standard deviation is received from a user or determined based on specifications for a server 106. If the pump volume is within an acceptable deviation of the command pump volume, the method 800 ends. If the pump volume is not within an acceptable deviation of the command pump volume, the method 800 adjusts 810 the pump volume. The method 800 adjusts 810 the pump volume by adjusting the PWM rate of the pumps 160. For example, the PWM control module 304 of the apparatus 102 adjusts the PWM rate of the pumps 160. The method 800 then repeats steps 804-810 of the method 800 until the pump volume is within an acceptable deviation of the command pump volume.

In some embodiments, if the pump volume is within an acceptable deviation of the command pump volume, the method 800 returns and may eventually receive 802 another commanded pump volume. In some embodiments, the method 800 is adjusted to use total current draw for determining pump volume of the cooling elements 104. In some examples, the method 800 compares the total current draw of the cooling elements 104 with a pump volume vs. current characteristic derived based on the determined number of cooling elements 104. In some examples, the method 800 multiplies current of a pump volume vs. current characteristic by the determined number of cooling elements 104.

In various embodiments, the method 800 is implemented by the determination module 202, the PWM module 204, the current measurement module 206, the comparison module 208, the type module 210, the range determination module 302, and/or the PWM control module 304.

Embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method comprising:

determining a quantity of a plurality of cooling elements providing cooling for a computing device, each of the plurality of cooling elements of a cooling element type of a plurality of cooling element types;

causing each of the plurality of cooling elements to operate at a same test pulse width modulation ("PWM") value, each cooling element of the plurality of cooling elements controlled using PWM;

measuring a total current draw of the plurality of cooling elements while each of the plurality of cooling elements operates at the test PWM value;

comparing the total current draw to each of a predicted current draw at the test PWM value of a quantity of cooling elements of a particular cooling element type of the plurality of cooling element types, the quantity of cooling elements of each of the cooling element types matching the determined quantity of the plurality of cooling elements; and determining, based at least in part on the comparing, whether each of the plurality of cooling elements are of a same cooling element type or are of a mixture of cooling element types.

2. The method of claim 1, wherein, in response to determining that each of the plurality of cooling elements are of a same cooling element type, further comprising determining from the measured total current draw which of the plurality of cooling element types comprise the plurality of cooling elements.

3. The method of claim 2, further comprising:

selecting current versus PWM data of the determined cooling element type; and using the total current draw of the plurality of cooling elements and the current versus PWM data to control PWM for each of the plurality of cooling elements.

4. The method of claim 1, wherein the plurality of cooling element types comprises two cooling element types and wherein:

a predicted current draw of a first cooling element type at the test PWM value comprises a first current and a predicted current draw of a second cooling element type at the test PWM value comprises a second current different from the first current; and determining whether each of the plurality of cooling elements are of a same cooling element type or are of a mixture of cooling element types comprises determining, while each of the plurality of cooling elements operates at the test PWM value, whether a measured total current draw of the plurality of cooling elements:

matches a first product of the first current and the quantity of the plurality of cooling elements, signifying that the plurality of cooling elements comprise the first cooling element type;

matches a second product of the second current and the quantity of the plurality of cooling elements, signifying that the plurality of cooling elements comprise the second cooling element type; and comprises a current between the first product and the second product, signifying that the plurality of cooling elements comprises cooling elements that are a mixture of the first cooling element type and the second cooling element type.

5. The method of claim 1, further comprising determining a number of ranges of predicted current draws, wherein each range of the number of ranges corresponds to a type of the plurality of cooling element types operating at the test PWM value.

6. The method of claim 1, wherein the test PWM value is within a PWM range such that values or ranges of predicted current draws of cooling elements of the plurality of cooling element types do not overlap.

7. The method of claim 6, wherein the test PWM value is between zero and 20%.

8. The method of claim 1, further comprising sending a notification to a user in response to determining that the plurality of cooling elements are of the mixture of cooling element types.

9. The method of claim 1, wherein each of the plurality of cooling elements comprises a fan and/or a pump.

10. The method of claim 1, further comprising measuring the total current draw through a circuit protection component.

11. An apparatus comprising:

a determination module configured to determine a quantity of a plurality of cooling elements providing cooling for a computing device, each of the plurality of cooling elements of a cooling element type of a plurality of cooling element types;

a pulse width modulation ("PWM") module configured to cause each of the plurality of cooling elements to operate at a same test PWM value, each cooling element of the plurality of cooling elements controlled using PWM;

a current measurement module configured to measure a total current draw of the plurality of cooling elements while each of the plurality of cooling elements operates at the test PWM value;

a comparison module configured to compare the total current draw to each of a predicted current draw at the test PWM value of a quantity of cooling elements of a particular cooling element type of the plurality of cooling element types, the quantity of cooling elements of each of the cooling element types matching the determined quantity of the plurality of cooling elements; and a type module configured to determine, based at least in part on the comparing, whether each of the plurality of cooling elements are of a same cooling element type or are of a mixture of cooling element types, wherein at least a portion of said modules comprises hardware circuits, a programmable hardware device and/or code, the code stored on non-transitory computer readable storage media.

12. The apparatus of claim 11, further comprising a type determination module configured to, in response to the type module determining that each of the plurality of cooling elements are of a same cooling element type, determine from the measured total current draw which of the plurality of cooling element types comprise the plurality of cooling elements operating at the test PWM value.

13. The apparatus of claim 12, further comprising a PWM control module configured to:

select current versus PWM data of the determined cooling element type; and use the total current draw of the plurality of cooling elements and the current versus PWM data to control PWM for each of the plurality of cooling elements.

14. The apparatus of claim 11, wherein the plurality of cooling element types comprises two cooling element types and wherein:

a predicted current draw of a first cooling element type at the test PWM value comprises a first current and a predicted current draw of a second cooling element type at the test PWM value comprises a second current different from the first current; and the comparison module is further configured to determine whether a measured total current draw of the plurality of cooling elements:

matches a first product of the first current and the quantity of the plurality of cooling elements, signifying that the plurality of cooling elements comprise the first cooling element type;

matches a second product of the second current and the quantity of the plurality of cooling elements, signifying that the plurality of cooling elements comprise the second cooling element type; and comprises a current between the first product and the second product, signifying that the plurality of cooling elements comprises cooling elements that are a mixture of the first cooling element type and the second cooling element type.

15. The apparatus of claim 11, further comprising a range determination module configured to determine a number of ranges of predicted current draws, wherein:

each range of the number of ranges corresponds to a type of the plurality of cooling element types; and the test PWM value comprises a PWM value at which none of the number of ranges overlap.

16. The apparatus of claim 11, wherein the test PWM value is within a PWM range such that values or ranges of predicted current draws of cooling elements of the plurality of cooling element types do not overlap.

17. The apparatus of claim 11, wherein the test PWM value is between zero and 20%.

18. The apparatus of claim 11, further comprising a notification module configured to send a notification to a user in response to the apparatus determining that the plurality of cooling elements are of a mixture of cooling element types.

19. The apparatus of claim 11, wherein each of the plurality of cooling elements comprises a fan and/or a pump.

20. A system, comprising:

a plurality of cooling elements, each of the plurality of cooling elements of a cooling element type of a plurality of cooling element types; and a computing device for which the plurality of cooling elements provide cooling, the computing device comprising:

a determination module configured to determine a quantity of a plurality of cooling elements providing cooling for a computing device, each of the plurality of cooling elements of a cooling element type of a plurality of cooling element types;

a pulse width modulation ("PWM") module configured to cause each of the plurality of cooling elements to operate at a same test PWM value, each cooling element of the plurality of cooling elements controlled using PWM;

a current measurement module configured to measure a total current draw of the plurality of cooling elements while each of the plurality of cooling elements operates at the test PWM value;

a comparison module configured to compare the total current draw to each of a predicted current draw at the test PWM value of a quantity of cooling elements of a particular cooling element type of the plurality of cooling element types, the quantity of cooling elements of each of the cooling element types matching the determined quantity of the plurality of cooling elements; and a type module configured to determine, based at least in part on the comparing, whether each of the plurality of cooling elements are of a same cooling element type or are of a mixture of cooling element types, wherein at least a portion of the modules comprises hardware circuits, a programmable hardware device and/or code, the code stored on non-transitory computer readable storage media.

* * * * *